(12) United States Patent
Seong et al.

(10) Patent No.: US 9,373,664 B2
(45) Date of Patent: Jun. 21, 2016

(54) VARIABLE RESISTANCE MEMORY DEVICES AND METHODS OF MANUFACTURING THE SAME

(71) Applicants: Dong-Jun Seong, Seongnam-si (KR); Youn-Seon Kang, Yongin-si (KR); Seung-Jae Jung, Suwon-si (KR); Jung-Dal Choi, Hwaseong-si (KR)

(72) Inventors: Dong-Jun Seong, Seongnam-si (KR); Youn-Seon Kang, Yongin-si (KR); Seung-Jae Jung, Suwon-si (KR); Jung-Dal Choi, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/682,506

(22) Filed: Apr. 9, 2015

(65) Prior Publication Data

US 2016/0027845 A1    Jan. 28, 2016

(30) Foreign Application Priority Data

Jul. 28, 2014    (KR) ........................ 10-2014-0095716

(51) Int. Cl.
  *H01L 29/06*    (2006.01)
  *H01L 27/24*    (2006.01)
  *H01L 45/00*    (2006.01)

(52) U.S. Cl.
  CPC ........ *H01L 27/2463* (2013.01); *H01L 27/2409* (2013.01); *H01L 45/1233* (2013.01)

(58) Field of Classification Search
  CPC ............ H01L 27/2463; H01L 27/2409; H01L 45/1233
  USPC .......................................................... 257/5
  See application file for complete search history.

(56) References Cited

U.S. PATENT DOCUMENTS

| 7,812,335 | B2 | 10/2010 | Scheuerlein |
| 7,884,349 | B2 | 2/2011 | Rinerson et al. |
| 7,995,374 | B2 | 8/2011 | Komura et al. |
| 8,394,669 | B2 | 3/2013 | Arita et al. |
| 2006/0215445 | A1 | 9/2006 | Baek et al. |
| 2009/0134431 | A1 | 5/2009 | Tabata et al. |
| 2009/0221146 | A1 | 9/2009 | Seko et al. |
| 2009/0267047 | A1* | 10/2009 | Sasago ................ H01L 27/2409 257/4 |
| 2010/0085142 | A1 | 4/2010 | Hosoi |
| 2011/0037045 | A1 | 2/2011 | Fukumizu et al. |
| 2011/0175051 | A1 | 7/2011 | Song et al. |
| 2012/0063201 | A1 | 3/2012 | Hayakawa et al. |
| 2014/0183435 | A1* | 7/2014 | Kim ........................ H01L 45/06 257/4 |

FOREIGN PATENT DOCUMENTS

| JP | 3889023 B2 | 3/2007 |
| JP | 2009-206418 A | 9/2009 |
| JP | 5159270 B2 | 3/2013 |

(Continued)

*Primary Examiner* — Tu-Tu Ho
(74) *Attorney, Agent, or Firm* — Harness, Dickey & Pierce

(57) ABSTRACT

A variable resistance memory device, and methods of manufacturing the same, include a plurality of first conductive structures extending in a first direction, a plurality of second conductive structures extending in a second direction crossing the first direction over the first conductive structures, the second conductive structures, and a plurality of memory cells that are formed at intersections at which the first conductive structures and the second conductive structures overlap each other, and each includes a selection element and a variable resistance element sequentially stacked. An upper surface of each of the first conductive structures has a width in the second direction less than a width of a bottom surface of each of the selection elements.

19 Claims, 23 Drawing Sheets

(56) References Cited

FOREIGN PATENT DOCUMENTS

| | | | |
|---|---|---|---|
| JP | 2014-033094 | A | 2/2014 |
| KR | 0697282 | B1 | 3/2007 |
| KR | 1169539 | B1 | 10/2010 |
| KR | 1094384 | B1 | 12/2011 |
| KR | 1119222 | B1 | 2/2012 |
| KR | 1312906 | B1 | 3/2012 |

* cited by examiner

VARIABLE RESISTANCE MEMORY DEVICES AND METHODS OF MANUFACTURING THE SAME

CROSS-REFERENCE TO RELATED APPLICATION

This application claims the benefit of priority under 35 USC §119 to Korean Patent Application No. 10-2014-0095716, filed on Jul. 28, 2014 in the Korean Intellectual Property Office (KIPO), the contents of which are incorporated by reference herein in their entirety.

BACKGROUND

1. Field

Example embodiments relate to semiconductor devices and/or methods of manufacturing the same. More particularly, example embodiments relate to variable resistance memory devices having a diode and/or methods of manufacturing the same.

2. Description of the Related Art

Recently, memory devices having a variable resistance property have been developed. Examples of the variable resistance memory devices may include a resistive random access memory (ReRAM) device, a phase change random access memory (PRAM) device, a magnetic random access memory (MRAM) device, etc.

The variable resistance memory device may have a cross point array structure in which memory cells including a selection element and a variable resistance element are formed at cross points at which upper conductive lines and lower conductive lines cross each other. For example, a diode may serve as the selection element. Improving the characteristics of the diode is needed in order to improve the reliability and operation characteristics of the variable resistance memory device.

SUMMARY

Example embodiments provide a variable resistance memory device having improved characteristics.

Example embodiments provide a method of manufacturing a variable resistance memory device having improved characteristics.

According to some example embodiments, there is provided a variable resistance memory device. The variable resistance memory device includes a plurality of first conductive structures extending in a first direction, a plurality of second conductive structures extending in a second direction crossing the first direction, and a plurality of memory cells formed at intersections at which the first conductive structures and the second conductive structures overlap each other, and each includes a selection element and a variable resistance element sequentially stacked. An upper surface of each of the first conductive structures has a width in the second direction less than a width of a bottom surface of each of the selection elements.

In example embodiments, each of the first conductive structure may include a plurality of protrusions in the first direction, and each of the protrusions may contact the bottom surface of each of the selection elements.

In example embodiments, each of the protrusions may have a width in the first direction less than a width of the bottom surface of each of the selection elements.

In example embodiments, upper and lower surfaces of each of the first conductive structures may have widths in the second direction greater than a width in the second direction of a central portion thereof.

In example embodiments, each of the first conductive structures may have a width in the second direction substantially constant in a vertical direction.

In example embodiments, each of the first conductive structures may include a barrier layer pattern and a conductive layer pattern sequentially stacked.

In example embodiments, a top surface of the barrier layer pattern may have a width in the second direction greater than a width of a bottom surface of the conductive layer pattern.

In example embodiments, a top surface of the barrier layer pattern may have a width in the second direction substantially the same as a width of a bottom surface of the conductive layer pattern.

In example embodiments, each of the selection elements may include first, second and third semiconductor patterns sequentially stacked.

In example embodiments, the first and third semiconductor patterns may be doped with different types of impurities, and the second semiconductor pattern may not be doped with impurities.

In example embodiments, the variable resistance element may include a first electrode, a variable resistance pattern and a second electrode sequentially stacked.

In example embodiments, the variable resistance pattern may include a perovskite-based material or a transition metal oxide.

In example embodiments, a bottom surface of the first electrode may have a width in the second direction less than a width of a top surface of the selection element.

In example embodiments, a bottom surface of the first electrode may have a width in the first direction less than a width of a top surface of the selection element.

In example embodiments, the second electrode may have an area less than an area of the variable resistance pattern.

In example embodiments, the second electrode may include a material substantially the same as that of the first electrode.

In example embodiments, the first and second directions may be substantially perpendicular to each other.

According to other example embodiments, there is provided a variable resistance memory device. The variable resistance memory device includes a first conductive structure having a protrusion thereon, a diode of which a bottom surface contacting a top surface of the protrusion and having an area greater than the top surface of the protrusion, a variable resistance element including a first electrode, a variable resistance pattern and a second electrode sequentially stacked on the diode, and a second conductive structure on the variable resistance element.

In example embodiments, the first conductive structure may extend in a first direction, and the second conductive structure may extend in a second direction that is not parallel to the first direction.

In example embodiments, the top surface of the protrusion may have a width in the second direction less than a width of the bottom surface of the diode.

In example embodiments, the top surface of the protrusion may have a width in the first direction less than a width of the bottom surface of the diode.

In example embodiments, the first conductive structure may include a plurality of protrusions in the first direction, and the variable resistance memory device may include a plurality of diodes in the first direction and a plurality of variable resistance elements in the first direction.

In example embodiments, the variable resistance memory device may further include a plurality of first conductive structures in the second direction and a plurality of second conductive structures in the first direction.

According to further example embodiments, there is provided a method of manufacturing a variable resistance memory device. In the method, a first conductive layer structure, a diode layer structure and a variable resistance layer structure are sequentially formed. A plurality of first openings each of which extends in a first direction is formed through the first conductive layer structure, the diode layer structure and the variable resistance layer structure to form a plurality of first conductive structures, a plurality of preliminary diodes and a plurality of preliminary variable resistance elements, respectively. Each of the first conductive structures is etched to have a width in a second direction substantially perpendicular to the first direction less than a width of each of the preliminary diodes. A second conductive layer structure is formed on the preliminary variable resistance elements. A plurality of second openings each of which extends in the second direction is formed through the preliminary diodes, the preliminary variable resistance elements and the second conductive layer structure to form a plurality of diodes, a plurality of variable resistance elements and a plurality of second conductive structures, respectively.

In example embodiments, when the plurality of first openings is formed, a dry etching process may be performed.

In example embodiments, when each of the first conductive structures is etched, a wet etching process may be performed.

In example embodiments, when the plurality of second openings is formed by a dry etching process, and an upper portion of each of the first conductive structures may be dry etched.

In example embodiments, after the forming a plurality of second openings, an upper portion of each of the first conductive structures may be wet etched.

In example embodiments, before the forming a second conductive layer structure, a plurality of second insulation layers may be formed to each fill a respective one of the first openings. The second conductive layer structure may be formed on the preliminary variable resistance elements and the second insulation layers.

In example embodiments, each of the second openings may be formed through the preliminary diodes, the preliminary variable resistance elements, the second conductive layer structure and the second insulation layers so that a plurality of diodes, a plurality of variable resistance elements, a plurality of second conductive structures and a plurality of second insulation layer patterns may be formed.

In example embodiments, each of the first conductive structures may be formed to extend in the first direction, each of the second conductive structures may be formed to extend in the second direction, and the diodes and the variable resistance elements may be formed at intersections at which the first and second conductive structures cross each other.

In example embodiments, the first conductive layer structure may be formed to include a barrier layer and a conductive layer sequentially stacked on the first insulation layer.

In example embodiments, the diode layer structure may include first, second and third semiconductor layers sequentially stacked on the first conductive layer structure.

In example embodiments, the first and third semiconductor layers may be doped with different types of impurities, and the second semiconductor layer may not be doped with impurities.

In example embodiments, the variable resistance layer structure may be formed to include a first electrode layer, a variable resistance layer and a second electrode layer sequentially stacked on the diode layer structure.

According to yet other example embodiments, a variable resistance memory device includes a first conductive structure and a second conductive structure traversing each other, and a memory cell electrically connecting the first and second conductive structures to each other, the memory cell including a selection element. The first conductive structure contacts a bottom surface of the selection element so as to partially expose the bottom surface of the selection element.

The variable resistance memory device may further include a first conductive structure pattern consisting of a plurality of first conductive structures each extending in a first direction and collectively arranged along a second direction, and a second conductive structure pattern consisting of a plurality of second conductive structures each extending in the second direction and collectively arranged along the first direction.

A surface of the first conductive structure that contacts the surface of the selection element may include a plurality of recesses.

The first conductive structure may include a barrier layer pattern and a conductive layer pattern sequentially stacked. A width of the conductive layer pattern may be equal to, or less than, a width of the barrier layer pattern.

The conductive layer pattern may have a plano-concave or bioconcave shape.

According to example embodiments, an upper surface of a conductive structure contacting a bottom surface of a selection element (e.g., a diode) included in a variable resistance memory device may have an area less than an area of the bottom surface of the selection element, and thus, when a reverse voltage is applied to the selection element, a level of a current that may leak through the selection element may decrease. Accordingly, the variable resistance memory device may have good electrical characteristics.

BRIEF DESCRIPTION OF THE DRAWINGS

Example embodiments will be more clearly understood from the following detailed description taken in conjunction with the accompanying drawings.

FIGS. 1 to 4 are a perspective view, a top view, and cross-sectional views illustrating a variable resistance memory device in accordance with some example embodiments;

FIGS. 5 to 7 are cross-sectional views illustrating a variable resistance memory device in accordance with other example embodiments;

FIGS. 8 to 19 are cross-sectional views and plan views illustrating stages of a method of manufacturing a variable resistance memory device in accordance with some example embodiments;

FIG. 20 is a perspective view illustrating a variable resistance memory device in accordance with other example embodiments, FIGS. 21 and 22 are cross-sectional views of the variable resistance memory device in FIG. 20;

FIG. 23 is a perspective view illustrating a variable resistance memory device in accordance with yet other example embodiments, FIGS. 24 and 25 are cross-sectional views of the variable resistance memory device in FIG. 23;

FIGS. 26 and 27 are cross-sectional views illustrating a stacked variable resistance memory device in accordance with some example embodiments;

FIGS. 28 and 29 are cross-sectional views illustrating a stacked variable resistance memory device in accordance with other example embodiments; and FIGS. 30 to 33 are cross-sectional views illustrating stages of a method of manufacturing a stacked variable resistance memory device in accordance with some example embodiments.

DESCRIPTION OF EXAMPLE EMBODIMENTS

Figure 1:
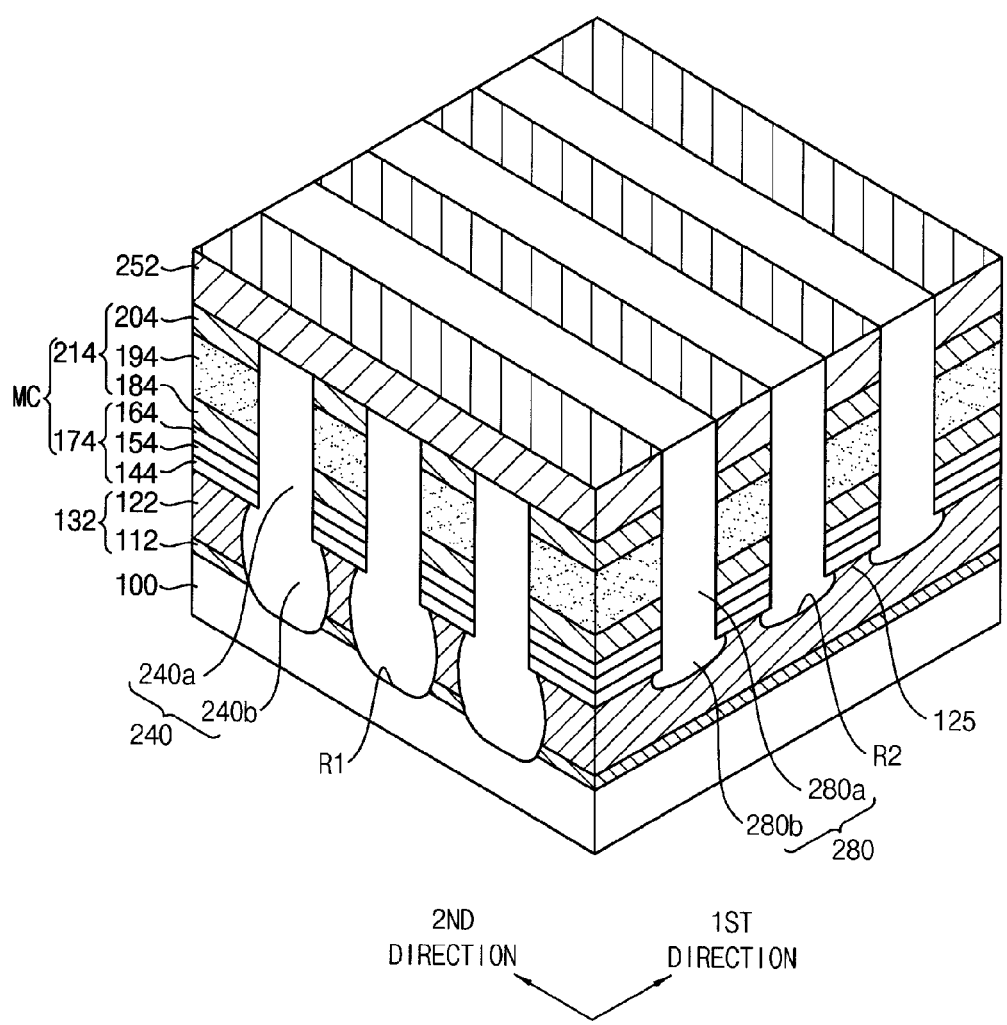
FIGS. 1 to 33 represent non-limiting, example embodiments as described herein.

Various example embodiments will be described more fully hereinafter with reference to the accompanying drawings, in which some example embodiments are shown. The present inventive concepts may, however, be embodied in many different forms and should not be construed as limited to the example embodiments set forth herein. Rather, these example embodiments are provided so that this description will be thorough and complete, and will fully convey the scope of the present inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Unless otherwise defined, all terms (including technical and scientific terms) used herein have the same meaning as commonly understood by one of ordinary skill in the art to which these inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
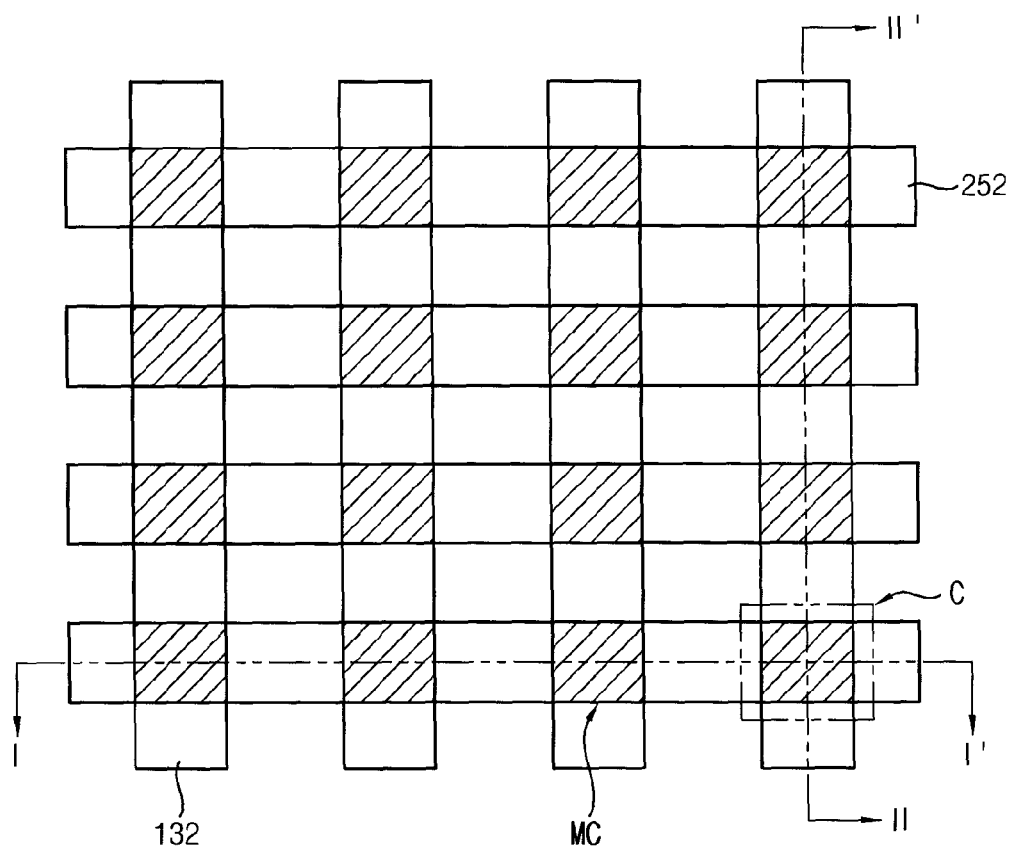
Figure 3:
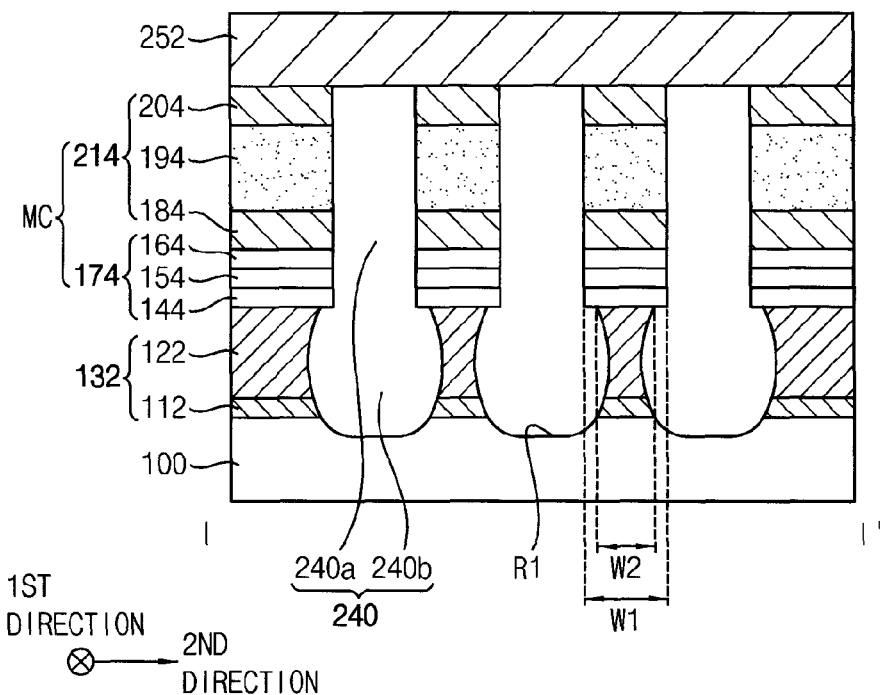
Figure 4:
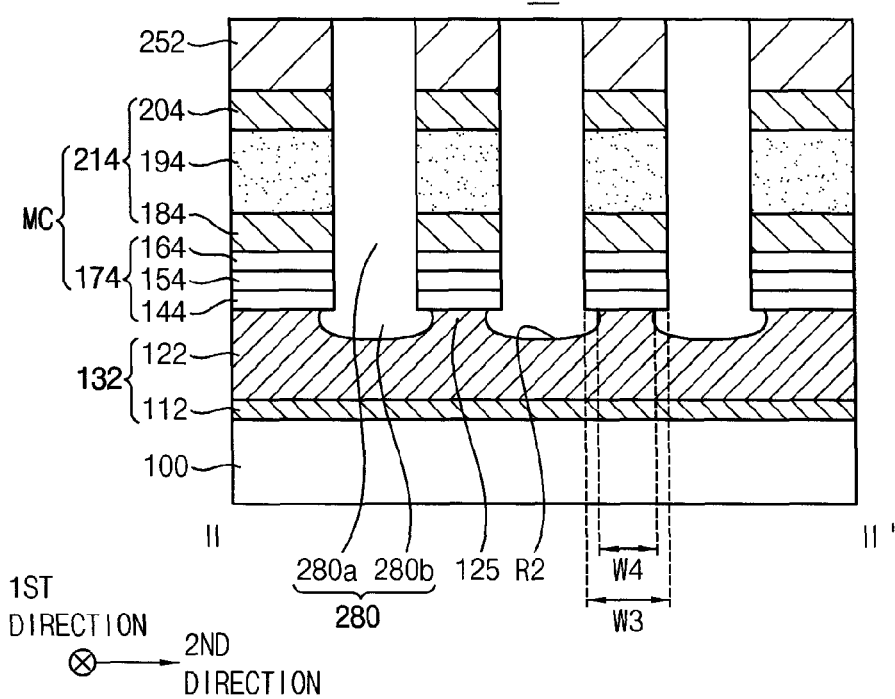

FIGS. 1 to 4 are a perspective view, a top view, and cross-sectional views illustrating a variable resistance memory device in accordance with some example embodiments. Particularly, FIG. 1 is a perspective view of the variable resistance memory device, FIG. 2 is a schematic plan view of the variable resistance memory device, FIG. 3 is a cross-sectional view cut along a line I-I' of the variable resistance memory device in FIG. 2, and FIG. 4 is a cross-sectional view cut along a line II-II' of the variable resistance memory device in FIG. 2.

For the convenience of explanation, FIG. 2 shows only a first conductive structure, a second conductive structure and a memory cell, and other structures are omitted therein. Thus, FIG. 2 is also a perspective view of the variable resistance memory devices shown in FIGS. 5-9, 11-16, 18, 19, 21, 22 and 24-33.

Referring to FIGS. 1 to 4, a variable resistance memory device 10 may include a first conductive structure 132, a second conductive structure 252, and a memory cell MC. The variable resistance memory device may further include a first insulation layer 100 and an insulation pattern structure.

The first conductive structure 132 may be formed on the first insulation layer 100. The first insulation layer 100 may include an insulating material, e.g., silicon oxide, silicon nitride, silicon oxynitride, etc. The first insulation layer 100 may cover lower structures, e.g., transistors (not shown) on a substrate (not shown).

In example embodiments, the first conductive structure 132 may extend in a first direction substantially parallel to a top surface of the first insulation layer 100, and a plurality of first conductive structures 132 may be formed in (or along) a second direction, which may be substantially parallel to the top surface of the first insulation layer 100 and cross the first direction.

In example embodiments, the first and second directions may be substantially perpendicular to each other. Alternatively, the first and second directions may cross each other at an acute angle. Hereinafter, the definitions of the first and second directions may be the same in all of the figures.

The first conductive structure 132 may include a barrier layer pattern 112 and a conductive layer pattern 122 sequentially stacked on the first insulation layer 100. Each of the barrier layer pattern 112 and the conductive layer pattern 122 may include a metal, e.g., tungsten, platinum, palladium, rhodium, ruthenium, iridium, copper, aluminum, titanium, tantalum, etc., or a metal nitride thereof. In example embodiments, the barrier layer pattern 112 and the conductive layer pattern 122 may include different materials. In an example embodiment, the barrier layer pattern 112 may include titanium nitride, and the conductive layer pattern 122 may include tungsten. The barrier layer pattern 112 may prevent a metal element of the conductive layer pattern 122 from diffusing into the first insulation layer 100, and may enhance adhesion between the first conductive structure 132 and the first insulation layer 100.

In example embodiments, upper and lower surfaces of the first conductive structure 132 may have a width in the second direction greater than a width in the second direction of a central portion of the first conductive structure 132. The first conductive structure 132 may have a width in the second direction that may gradually increase from the central portion toward the upper or lower surface. The first conductive structure 132 may have a plano-concave shape wherein one of two opposing sidewalls has a concave shape and the other of the two opposing sidewalls is linear, or a bioconcave shape wherein two opposing sidewalls have a concave shape.

A plurality of protrusions 125 may be formed in the first direction on the first conductive structure 132. Particularly, the plurality of protrusions 125 may be formed on the conductive layer pattern 122.

In example embodiments, the first conductive structure 132 may serve as a bit line or a word line of the variable resistance memory device.

The second conductive structure 252 may be formed on the first conductive structure 132. In example embodiments, the second conductive structure 252 may extend in the second direction, and a plurality of second conductive structures 252 may be formed in, or along, the first direction.

The second conductive structure 252 may include a metal, e.g., tungsten, platinum, palladium, rhodium, ruthenium, iridium, copper, aluminum, titanium, tantalum, etc., or a metal nitride thereof. The second conductive structure 252 may further include a barrier layer pattern (not shown). The second conductive structure 252 may include a material substantially the same as, or different from, a material of the conductive layer pattern 122 of the first conductive structure 132. In an example embodiment, the second conductive structure 252 may include tungsten.

In example embodiments, the second conductive structure 252 may serve as a word line or a bit line of the variable resistance memory device. For example, when the first conductive structure 132 serves as a bit line of the variable resistance memory device, the second conductive structure 252 may serve as a word line of the variable resistance memory device. Alternatively, when the first conductive structure 132 serves as a word line of the variable resistance memory device, the second conductive structure 252 may serve as a bit line of the variable resistance memory device.

The memory cell MC may be formed at an intersection C at which the first and second conductive structures 132 and 252 may cross, traverse, or overlap each other. In example embodiments, according as the plurality of first and second conductive structures 132 and 252 may be formed, a plurality of memory cells MCs may be formed at a plurality of intersections Cs, respectively. Thus, a plurality of memory cells MCs disposed in the first direction may define a memory cell column, and a plurality of memory cells MCs disposed in the second direction may define a memory cell row. A plurality of memory cell columns and a plurality of memory cell rows may define a memory cell array.

The memory cell MC may include a selection element 174 and a variable resistance element 214 sequentially stacked on the first conductive structure 132.

In example embodiments, the selection element 174 may include a diode, and thus may include first, second and third semiconductor patterns 144, 154 and 164 sequentially stacked.

The first semiconductor pattern 144 may include a semiconductor material doped with first impurities. The first impurities may include n-type impurities, e.g., phosphorous, arsenic, etc., and the semiconductor material may include, e.g., silicon, germanium, etc. The third semiconductor pattern 164 may include a semiconductor material doped with second impurities. The second impurities may include p-type impurities, e.g., boron, indium, etc., and the semiconductor material may include, e.g., silicon, germanium, etc.

The second semiconductor pattern 154 may include a semiconductor material, e.g., undoped polysilicon. Alternatively, the second semiconductor pattern 154 may include a semiconductor material doped with impurities of which a doping concentration may be much lower than those of the first and second impurities of the first and third semiconductor patterns 144 and 164, respectively. Thus, the impurities doped into the semiconductor material of the second semiconductor pattern 154 may not affect the operation of the diode.

As the diode may include the first, second and third semiconductor patterns 144, 154 and 164 sequentially stacked, a P-I-N diode may be formed. Alternatively, the diode may include only the first and third semiconductor patterns 144 and 164, and thus a P-N diode may be formed.

A bottom surface of the selection element 174 may contact the upper surface of the first conductive structure 132. In example embodiments, a second width W2 of the upper surface of the first conductive structure 132 in the second direction may be less than a first width W1 of the bottom surface of the selection element 174 in the second direction. The bottom surface of the selection element 174 may be partially exposed In example embodiments, the bottom surface of the selection element 174 may contact a top surface of the protrusion 125 of the first conductive structure 132. A fourth width W4 of the top surface in the first direction of the protrusion 125 may be less than a third width W3 of the bottom surface in the first direction of the selection element 174 contacting the top surface of the protrusion 125.

As the upper surface of the first conductive structure 132 contacting the bottom surface of the selection element 174 may have widths in the first and second directions less than those of the bottom surface of the selection element 174 in the first and second directions, respectively, the upper surface of the first conductive structure 132 contacting the bottom surface of the selection element 174 may have an area less than that of the bottom surface of the selection element 174. Thus, when a reverse voltage is applied to the selection element 174, a level of a reverse current that may leak through the selection element 174 before approaching a breakdown voltage may decrease.

In example embodiments, the variable resistance element 214 may include a first electrode 184, a variable resistance pattern 194 and a second electrode 204 sequentially stacked.

Each of the first and second electrodes 184 and 204 may include a metal nitride or a metal silicon nitride, e.g., titanium nitride, titanium silicon nitride, tungsten nitride, tungsten silicon nitride, tantalum nitride, tantalum silicon nitride, zirconium nitride, zirconium silicon nitride, etc. In example embodiments, the first and second electrodes 184 and 204 may include different materials from the first and second conductive structures 132 and 252. Alternatively, the first and second electrodes 184 and 204 may include substantially the same material as the first and second conductive structures 132 and 252. In an example embodiment, each of the first and second electrodes 184 and 204 may include titanium nitride.

In example embodiments, the variable resistance pattern 194 may include a material of which an electrical resistance may be changed due to an oxygen vacancy, or oxygen migration. In this case, the variable resistance memory device may be a resistive random access memory (ReRAM) device.

For example, the variable resistance pattern 194 may include a perovskite-based material or a transition metal oxide. The perovskite-based material may include, e.g., STO ($SrTiO_3$), BTO ($BaTiO_3$), PCMO ($Pr_{1-x}Ca_xMnO_3$), etc. The transition metal oxide may include titanium oxide ($TiO_x$), zirconium oxide ($ZrO_x$), aluminum oxide ($AlO_x$), hafnium oxide ($HfO_x$), tantalum oxide ($TaO_x$), niobium oxide ($NbO_x$), cobalt oxide ($CoO_x$), tungsten oxide ($WO_x$), lanthanum oxide ($LaO_x$) or zinc oxide ($ZnO_x$). These may be used alone or in a combination thereof.

In example embodiments, the variable resistance pattern 194 may have a single layer structure, or a multi-layered structure including the above-mentioned materials.

In example embodiments, the variable resistance pattern 194 may include a material of which a resistance may be changed by a phase change or a phase transition. In this case, the variable resistance memory device may be a phase-change random access memory (PRAM) device. For example, the variable resistance pattern 194 may include a chalcogenide-based material in which germanium (Ge), antimony (Sb) and/or tellurium (Te) are combined by a given ratio.

In example embodiments, the variable resistance pattern 194 may include a material of which a resistance may be changed by a magnetic field or a spin transfer torque (STT). In this case, the variable resistance memory device may be a magnetic random access memory (MRAM) device. For example, the variable resistance pattern 194 may include a ferromagnetic material, e.g., iron (Fe), nickel (Ni), cobalt (Co), dysprosium (Dy), gadolinium (Gd), etc.

The insulation layer pattern structure may be formed between neighboring memory cells MCs and cover sidewalls thereof, and may include second and third insulation layer patterns 240 and 280 crossing each other.

The second insulation layer pattern 240 may extend in the first direction, and may include an upper portion 240a and a lower portion 240b. The upper portion 240a of the second insulation layer pattern 240 may be formed between the memory cells MCs adjacent to each other in the second direction, and the lower portion 240b of the second insulation layer pattern 240, which may be formed integrally with the upper portion 240a, may be formed between the first conductive structures 132 adjacent to each other in the second direction. In example embodiments, the lower portion 240b of the second insulation layer pattern 240 may have a maximum width in the second direction greater than that of the upper portion 240a of the second insulation layer pattern 240.

The lower portion 240b of the second insulation layer pattern 240 may be formed on a first recess R1 on the first insulation layer 100, and may contact an edge portion in the second direction of the bottom surface of the selection element 174.

The third insulation layer pattern 280 may extend in the second direction, and may include an upper portion 280a and a lower portion 280b. The upper portion 280a of the third insulation layer pattern 280 may be formed between the memory cells MCs and between the second conductive structures 252 adjacent to each other in the first direction, and the lower portion 280b of the third insulation layer pattern 280, which may be formed integrally with the upper portion 280a, may be formed between the protrusions 125 of the first conductive structures 132 adjacent to each other in the first direction. In example embodiments, the lower portion 280b of the third insulation layer pattern 280 may have a maximum width in the first direction greater than that of the upper portion 280a of the third insulation layer pattern 280.

The lower portion 280b of the third insulation layer pattern 280 may be formed on a second recess R2 on the first insulation layer 100, and may contact an edge portion in the first direction of the bottom surface of the selection element 174.

Each of the second and third insulation layer patterns 240 and 280 may include an oxide, e.g., silicon oxide. In example embodiments, the second and third insulation layer patterns 240 and 280 may include substantially the same material, and thus may be formed integrally.

As illustrated above, the upper surface of the first conductive structure 132 contacting the bottom surface of the selection element 174 may have an area less than that of the bottom surface of the selection element 174, and thus when a reverse voltage is applied to the selection element 174, the level of the current that may leak through the selection element 174 before approaching the breakdown voltage may decrease. Thus, the variable resistance memory device may have good electrical characteristics.

Figure 5:
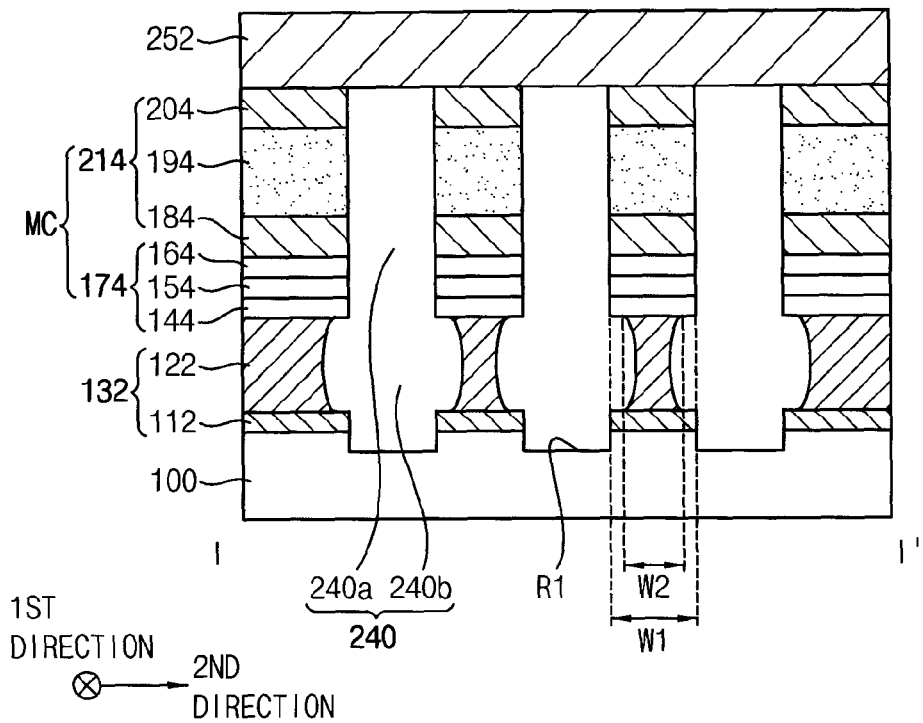
Figure 6:
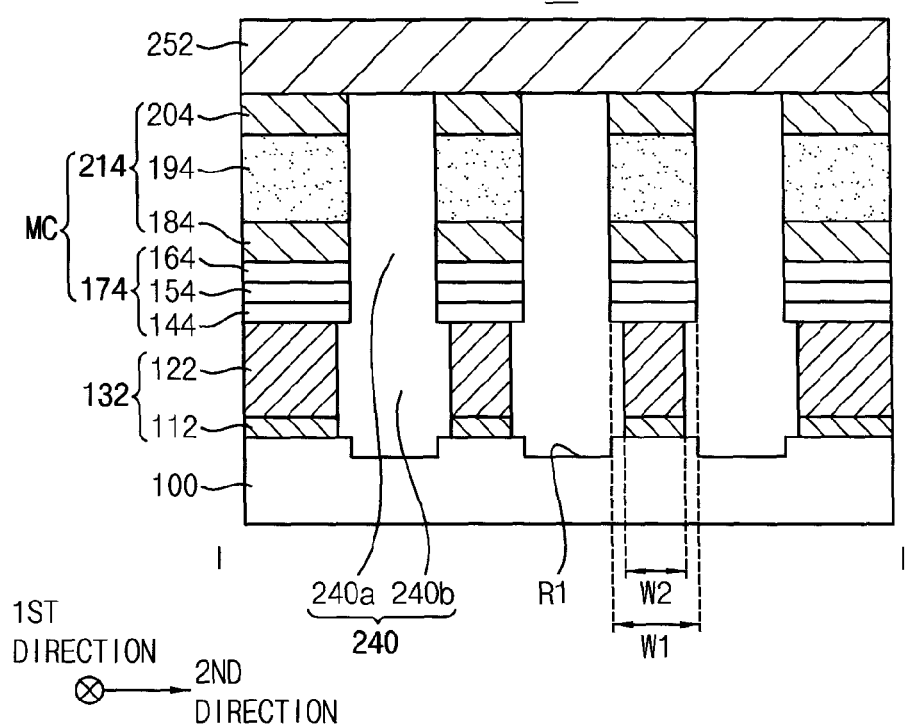
Figure 7:
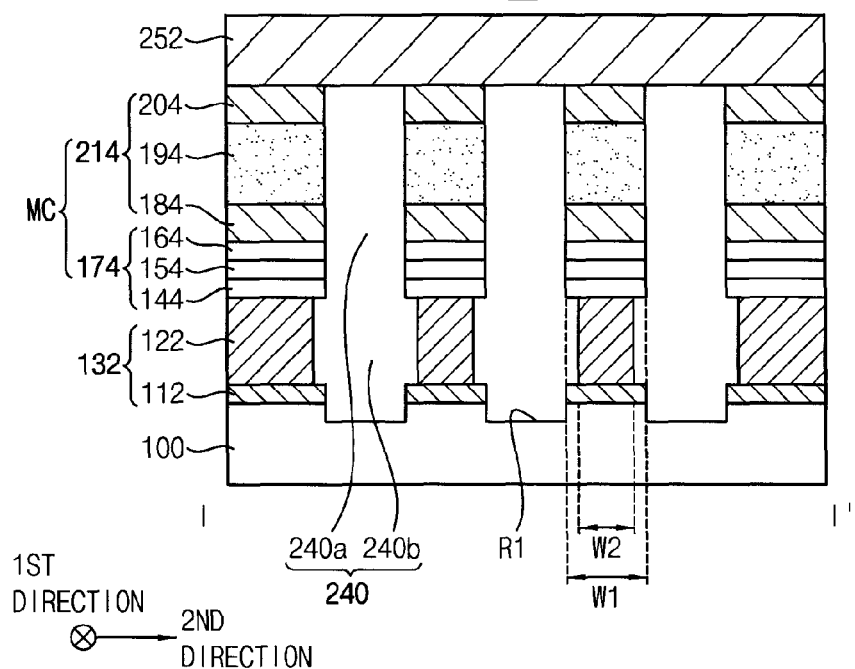

FIGS. 5 to 7 are cross-sectional views illustrating a variable resistance memory device in accordance with other example embodiments. Particularly, FIGS. 5 to 7 are cross-sectional views cut along a line I-I' in FIG. 2 of variable resistance memory devices according to other example embodiments.

Variable resistance memory devices 20, 30 and 40 of FIGS. 5 to 7, respectively, are substantially the same as, or similar to, that of FIGS. 1 to 4, except for the shape of the first conductive structure and the insulation layer pattern. Thus, like reference numerals refer to like elements, and detailed descriptions thereon are omitted herein.

Referring to FIG. 5, the variable resistance memory device 20 may include a first conductive structure 132, a second conductive structure 252 and a memory cell MC. The variable resistance memory device 20 may further include a first insulation layer 100 and an insulation layer pattern structure.

The first conductive structure 132 may include a barrier layer pattern 112 and a conductive layer pattern 122 sequentially stacked.

A second width W2 in the second direction of an upper surface of the conductive layer pattern 122 may be less than a first width W1 in the second direction of a bottom surface of the selection element 174 contacting the upper surface of the conductive layer pattern 122. A width in the second direction of an upper surface of the barrier layer pattern 112 may be substantially the same as the first width W1 in the second direction of the bottom surface of the selection element 174, and thus may be greater than the second width W2 of the upper surface of the conductive layer pattern 122.

A width in the second direction of the conductive layer pattern 122 may gradually increase from a central portion toward the upper or lower surface, and a width in the second direction of the barrier layer pattern 112 may be substantially constant along a vertical direction.

Referring to FIG. 6, the variable resistance memory device 30 may include a first conductive structure 132, a second conductive structure 252 and a memory cell MC. The variable resistance memory device 30 may further include a first insulation layer 100 and an insulation layer pattern structure.

The first conductive structure 132 may include a barrier layer pattern 112 and a conductive layer pattern 122 sequentially stacked.

A second width W2 in the second direction of an upper surface of the first conductive structure 132 may be less than a first width W1 in the second direction of a bottom surface of the selection element 174 contacting the upper surface of the first conductive structure 132. A width in the second direction of the first conductive structure 132 may be substantially constant along the vertical direction.

Referring to FIG. 7, the variable resistance memory device 40 may include a first conductive structure 132, a second conductive structure 252 and a memory cell MC. The variable resistance memory device 40 may further include a first insulation layer 100 and an insulation layer pattern structure.

The first conductive structure 132 may include a barrier layer pattern 112 and a conductive layer pattern 122 sequentially stacked.

A second width W2 in the second direction of an upper surface of the conductive layer pattern 122 may be less than a first width W1 in the second direction of a bottom surface of the selection element 174 contacting the upper surface of the conductive layer pattern 122. A width in the second direction of an upper surface of the barrier layer pattern 112 may be substantially the same as the first width W1 in the second direction of the bottom surface of the selection element 174, and thus may be greater than the second width W2 of the upper surface of the conductive layer pattern 122.

A width in the second direction of the conductive layer pattern 122 may be substantially constant along the vertical direction, and a width in the second direction of the barrier layer pattern 112 may be also substantially constant along the vertical direction.

In each of the variable resistance memory devices 20, 30 and 40 shown in FIGS. 5 to 7, as in the variable resistance memory device 10 shown in FIGS. 1 to 4, the upper surface of the first conductive structure 132 contacting the bottom surface of the selection element 174 may have an area less than that of the bottom surface of the selection element 174, and thus, when a reverse voltage is applied to the selection element 174, a level of a reverse current that may leak through the selection element 174 before approaching a breakdown voltage may decrease.

Figure 8:
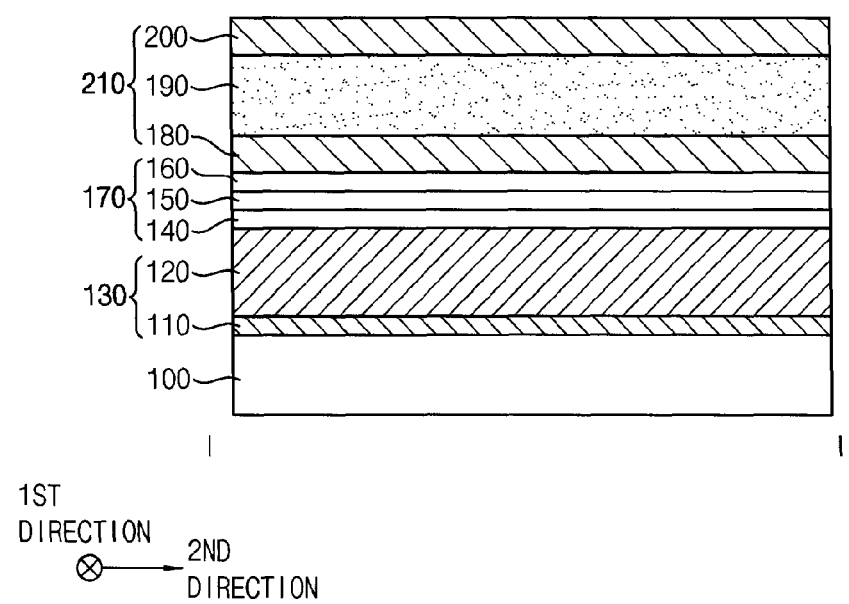
Figure 9:
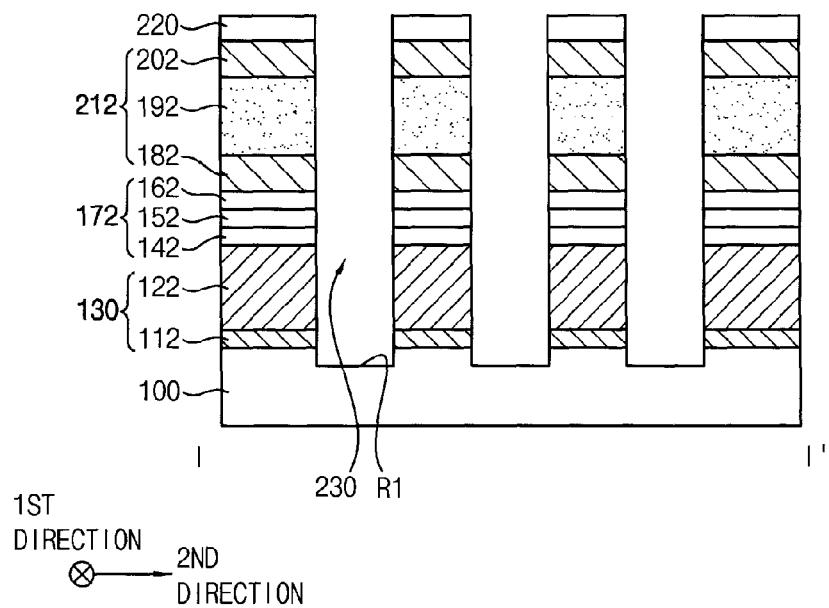
Figure 10:
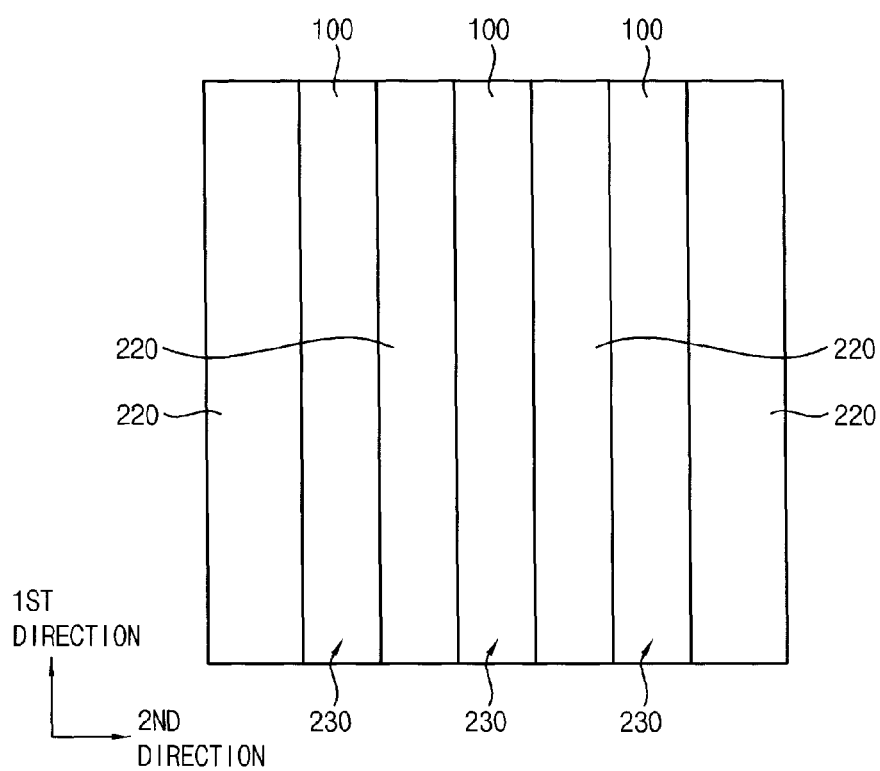
Figure 15:
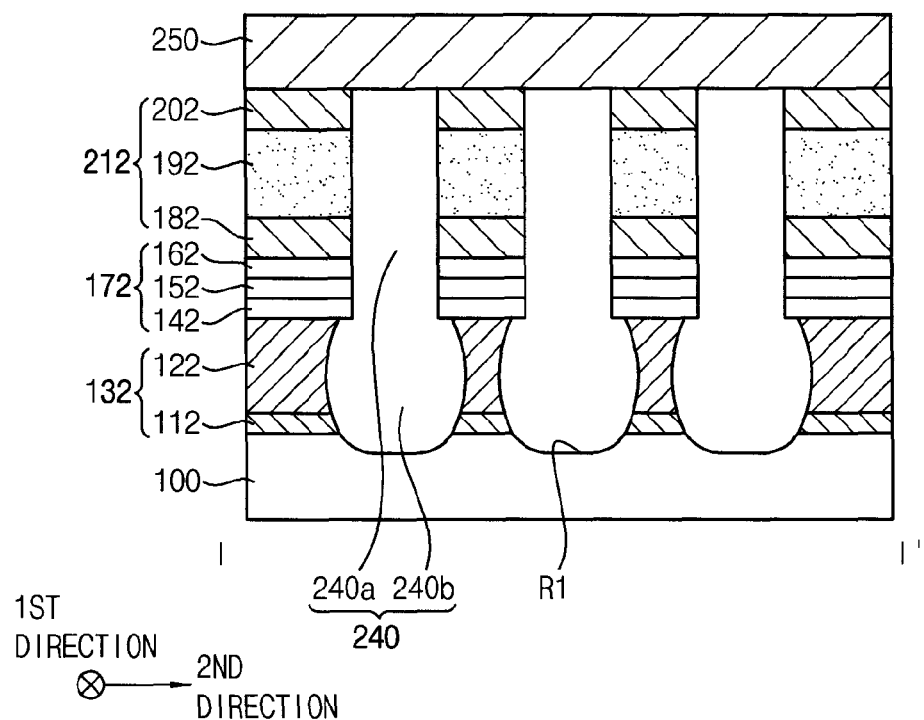
Figure 16:
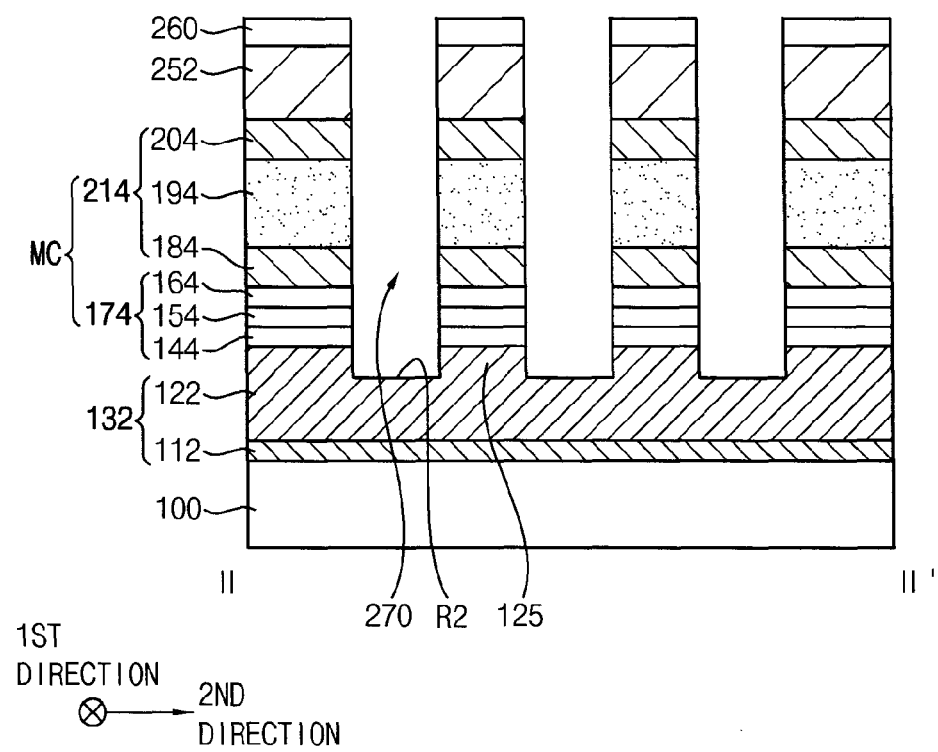
Figure 17:
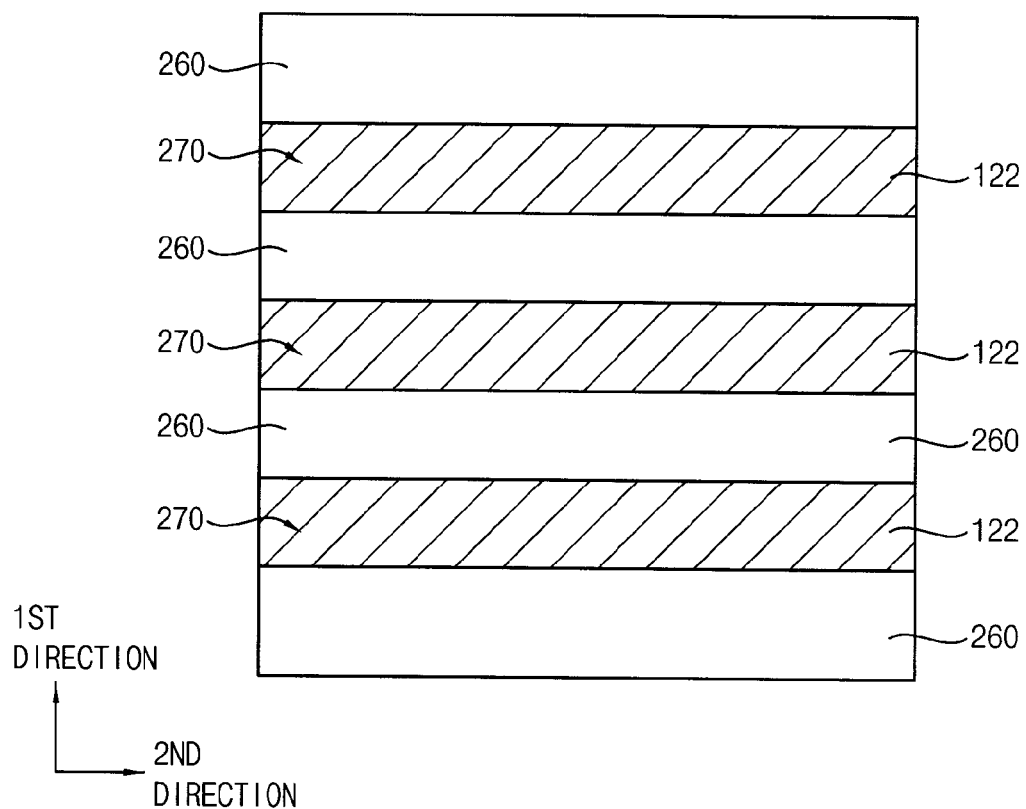

FIGS. 8 to 19 are cross-sectional views and plan views illustrating stages of a method of manufacturing a variable resistance memory device in accordance with some example embodiments. Particularly, FIGS. 8, 9 and 11-15 are cross-sectional views cut along a line I-I' in FIG. 2, FIGS. 16, 18 and 19 are cross-sectional views cut along a line II-II' in FIG. 2, and FIGS. 10 and 17 are plan views.

Referring to FIG. 8, a first conductive layer structure 130, a diode layer structure 170 and a variable resistance layer structure 210 may be sequentially formed on a first insulation layer 100. The first conductive layer structure 130, the diode layer structure 170 and the variable resistance layer structure 210 may be formed by, e.g., a physical vapor deposition (PVD) process, an atomic layer deposition (ALD) process, a chemical vapor deposition (CVD) process, etc.

The first insulation layer 100 may be formed to include an insulating material, e.g., silicon oxide, silicon nitride or silicon oxynitride. The first insulation layer 100 may cover lower structures (not shown), e.g., transistors, formed on a substrate (not shown).

In example embodiments, the first conductive layer structure 130 may be formed to include a barrier layer 110 and a conductive layer 120 sequentially stacked. Each of the barrier layer 110 and the conductive layer 120 may be formed to include a metal, e.g., tungsten, platinum, palladium, rhodium, ruthenium, iridium, copper, aluminum, titanium, tantalum, etc., or a metal nitride thereof. In example embodiments, the barrier layer 110 and the conductive layer 120 may be formed to include different materials. In an example embodiment, the barrier layer 110 may be formed to include titanium nitride, and the conductive layer 120 may be formed to include tungsten.

In example embodiments, the diode layer structure 170 may be formed to include first, second and third semiconductor layers 140, 150 and 160 sequentially stacked.

Particularly, a preliminary first semiconductor layer, a preliminary second semiconductor layer and a preliminary third semiconductor layer may be sequentially formed on the first conductive layer structure 130. In example embodiments, the preliminary first, second and third semiconductor layers may be formed to include a semiconductor material, e.g., silicon, germanium, etc. The preliminary first semiconductor layer may be doped with n-type impurities, e.g., phosphorous, arsenic, etc., and the preliminary third semiconductor layer may be doped with p-type impurities, e.g., boron, indium, etc.

An annealing process may be performed on the preliminary first, second and third semiconductor layers so that the impurities doped in the preliminary first, second and third semiconductor layers may be diffused uniformly. Thus, the preliminary first, second and third semiconductor layers may be converted into the first, second and third semiconductor layers 140, 150 and 160, respectively.

In example embodiments, the variable resistance layer structure 210 may be formed to include a first electrode layer 180, a variable resistance layer 190 and a second electrode layer 200 sequentially stacked.

The first and second electrode layers 180 and 200 may be formed to include a metal nitride or a metal silicon nitride, e.g., titanium nitride, titanium silicon nitride, tungsten nitride, tungsten silicon nitride, tantalum nitride, tantalum silicon nitride, zirconium nitride, zirconium silicon nitride, etc. These may be used alone or in a combination thereof. In example embodiments, the first and second electrode layers 180 and 200 may be formed to include a material different from that of the first conductive layer structure 130. Alternatively, the first and second electrode layers 180 and 200 may be formed to include a material substantially the same as that of the first conductive layer structure 130. In an example embodiment, the first and second electrode layers 180 and 200 may be formed to include titanium nitride.

The variable resistance layer 190 may be formed to include a material of which an electrical resistance may be changed due to an oxygen vacancy or oxygen migration, e.g., a perovskite-based material or a transition metal oxide. For example, the perovskite-based material may include STO, BTO, PCMO, etc., and the transition metal oxide may include titanium oxide, zirconium oxide, aluminum oxide, hafnium oxide, tantalum oxide, niobium oxide, cobalt oxide, tungsten oxide, lanthanum oxide, zinc oxide, etc. These may be used alone or in a combination thereof. In example embodiments, the variable resistance layer 190 may be formed to have a single layer structure or a multi-layered structure including the above materials.

In some example embodiments, the variable resistance layer 190 may be formed to include a material of which a resistance may be changed by a phase change or a phase transition. For example, the variable resistance layer 190 may be formed to include a chalcogenide-based material in which germanium (Ge), antimony (Sb) and/or tellurium (Te) are combined by a given ratio. In some example embodiments, the variable resistance layer 190 may be formed to include a material of which a resistance may be changed by a magnetic field or a spin transfer torque (STT). For example, the variable resistance layer 190 may be formed to include a ferromagnetic material, e.g., iron (Fe), nickel (Ni), cobalt (Co), dysprosium (Dy), gadolinium (Gd), etc.

Referring to FIGS. 9 and 10, the variable resistance layer 210, the diode layer 170 and the first conductive layer structure 130 may be sequentially etched to form a first opening 230 therethrough exposing a top surface of the first insulation layer 100.

In example embodiments, the first opening 230 may be formed by a first dry etching process using a first etching mask 220. The first dry etching process may be performed using a proper etching gas according to etching object layers. In an example embodiment, an upper portion of the first insulation layer 100 may be also removed by the first dry etching process to form a first recess R1 on the first insulation layer 100.

In example embodiments, the first opening 230 may be formed to extend in the first direction, and a plurality of first openings 230 may be formed in the second direction. Thus, the variable resistance layer structure 210, the diode layer structure 170 and the first conductive layer structure 130 may be transformed into a preliminary variable resistance element 212, a preliminary diode 172 and a first conductive structure 132, respectively, and a plurality of preliminary variable resistance elements 212, a plurality of preliminary diodes 172, and a plurality of first conductive structures 132 may be formed in the second direction. The first conductive structure 132 may be formed to include a barrier layer pattern 112 and a conductive layer pattern 122 sequentially stacked, the preliminary diode 172 may be formed to include preliminary first, second and third semiconductor patterns 142, 152 and 162 sequentially stacked, and the preliminary variable resistance element 212 may be formed to include a preliminary first electrode 182, a preliminary variable resistance pattern 192 and a preliminary second electrode 202 sequentially stacked.

Figure 11:
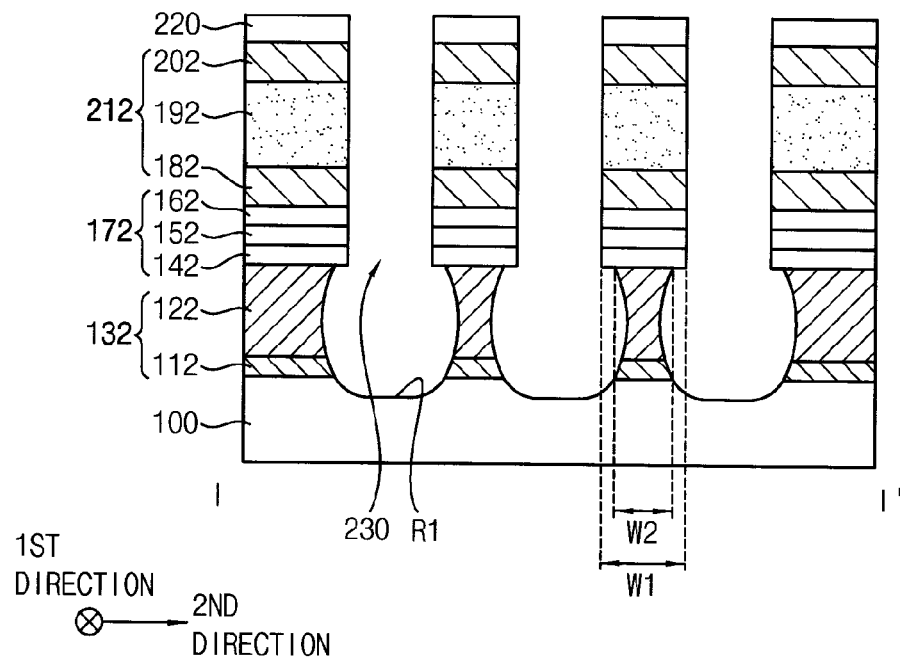

Referring to FIG. 11, a first wet etching process may be performed on the first conductive structure 132 so that a width in the second direction of the first conductive structure 132 may be less than that of the preliminary diode 172, and thus a lower portion of the first opening 230 may be enlarged in the second direction.

As the first wet etching process may be performed, a sidewall of the first conductive structure 132 may be partially removed, and an upper portion of the first insulation layer 100 may be also partially removed. Thus, a second width W2 in the second direction of an upper surface of the first conductive structure 132 may be less than a first width W1 in the second direction of a bottom surface of the preliminary diode 172. The first wet etching process may have isotropical (or isotropic) etching characteristics, and thus a width in the second direction of the first conductive structure 132 may gradually increase from a central portion toward the upper or lower surface.

Figure 12:
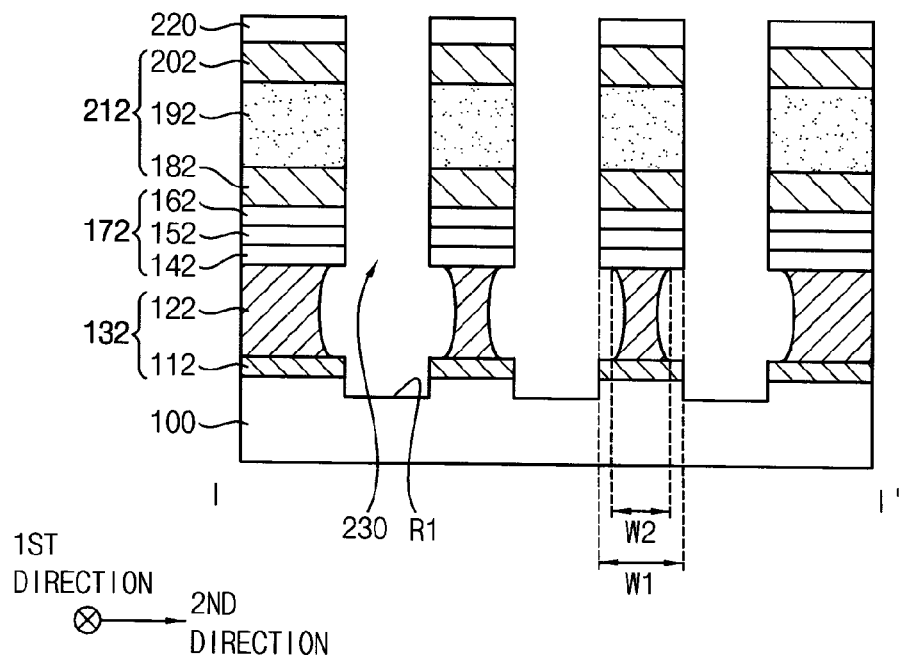

FIG. 12 illustrates that a width in the second direction of the conductive layer pattern 122 of the first conductive structure 132 becomes less than that of the preliminary diode 172 after performing the first wet etching process on the first conductive structure 132.

That is, the barrier layer pattern 112 and the conductive layer structure 122 in the first conductive structure 132 may include different materials from each other, and when the first wet etching process may be performed using an etching solution having a high etching selectivity therebetween, the conductive layer pattern 122 may be mostly etched and the barrier layer pattern 112 may not be substantially etched.

Accordingly, the second width W2 in the second direction of an upper surface of the conductive layer pattern 122 may become less than the first width W1 in the second direction of a bottom surface of the preliminary diode 172, however, the barrier layer pattern 112 may have a width in the second direction substantially the same as the first width W1 in the second direction of the bottom surface of the preliminary diode 172.

Figure 13:
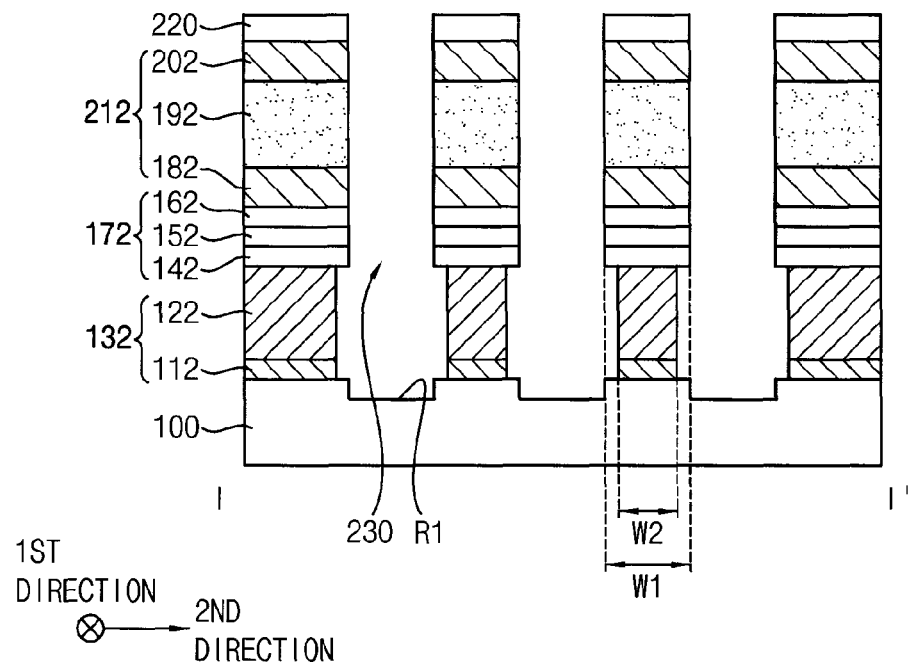

FIG. 13 illustrates that a width in the second direction of the first conductive structure 132 becomes less than that of the preliminary diode 172 after performing a second dry etching process on the first conductive structure 132.

That is, after forming the first opening 230 to expose the top surface of the first insulation layer 100, the second dry etching process may be further performed on the first conductive structure 132 to partially remove a sidewall of the first conductive structure 132. Thus, the second width W2 in the second direction of an upper surface of the first conductive structure 132 may become less than the first width W1 in the second direction of a bottom surface of the preliminary diode 172. An etching gas having a high etch rate for the first conductive structure 132 may be used to selectively remove the sidewall of the first conductive structure 132.

In example embodiments, the first and second dry etching processes may be performed in-situ. Alternatively, the first and second dry etching processes may be performed simultaneously.

That is, in the first dry etching process for forming the first opening 230, the first conductive structure 132 may be etched to have a width substantially the same as the first width W1 of the preliminary diode 172, and an etching gas used in the first dry etching process may be further provided so that the upper surface of the first conductive structure 132 may have the second width W2 less than the first width W1 of the bottom surface of the preliminary diode 172. Alternatively, in the first dry etching process, when the first conductive layer structure 130 is etched, an etching gas may be provided at a flow rate higher than a flow rate that may be proper for forming the first opening 230, so that the upper surface of the first conductive structure 132 may have the second width W2 less than the first width W1 of the bottom surface of the preliminary diode 172.

The second dry etching process may have anisotropical (or anisotropic) characteristics, and thus the first conductive structure 132 may have a width in the second direction substantially constant in the vertical direction.

Figure 14:
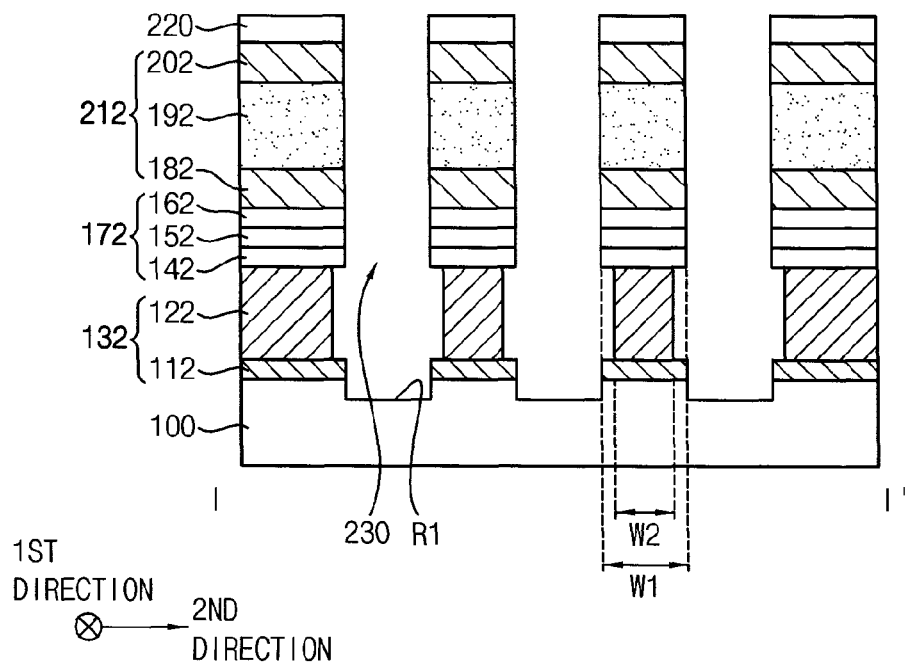

FIG. 14 illustrates that a width in the second direction of the conductive pattern 122 of the first conductive structure 132 becomes less than that of the preliminary diode 172 after performing a second dry etching process on the first conductive structure 132.

That is, the barrier layer pattern 112 and the conductive layer pattern 122 in the first conductive structure 132 may include different materials from each other, and when the second dry etching process may be performed using an etching gas having a high etching selectivity therebetween, the conductive layer pattern 122 may be mostly etched and the barrier layer pattern 112 may not be substantially etched.

Accordingly, the second width W2 in the second direction of an upper surface of the conductive layer pattern 122 may become less than the first width W1 in the second direction of a bottom surface of the preliminary diode 172, however, the barrier layer pattern 112 may have a width in the second direction substantially the same as the first width W1 in the second direction of the bottom surface of the preliminary diode 172.

Hereinafter, only the case in which the first wet etching process may be performed as illustrated with reference to FIG. 11 will be described.

Referring to FIG. 15, after removing the first etching mask 220, a second insulation layer pattern 240 may be formed to fill the first opening 230.

The second insulation layer pattern 240 may be formed by forming a second insulation layer on the top surface of the first insulation layer 100 exposed by the first recess R1 and a top surface of the preliminary second electrodes 202 to sufficiently fill the first openings 230, and planarizing the second insulation layer until the top surface of the preliminary second electrodes 202 may be exposed. The second insulation layer may be formed to include an oxide, e.g., silicon oxide.

In example embodiments, the second insulation layer pattern 240 may be formed to extend in the first direction, and a plurality of second insulation layer patterns 240 may be formed in the second direction. Each of the second insulation layer patterns 240 may be formed to include an upper portion 240a between neighboring preliminary diodes 172 in the second direction and between neighboring preliminary variable resistance elements 172 in the second direction, and a lower portion 240b between neighboring first conductive structures 132 in the second direction, which may be integrally formed with the upper portion 240a. In example embodiments, the lower portion 240b of the second insulation layer pattern 240 may have a maximum width in the second direction greater than that of the upper portion 240a of the second insulation layer pattern 240.

The lower portion 240b may be formed on the first recess R1 on the first insulation layer 100, and may contact an edge in the second direction of the bottom surface of the preliminary diode 172.

A second conductive layer structure 250 may be formed on the preliminary variable resistance elements 212 and the second insulation layer patterns 240.

The second conductive layer structure 250 may be formed to include a metal, e.g., tungsten, platinum, palladium, rhodium, ruthenium, iridium, copper, aluminum, titanium, tantalum, etc., or a metal nitride thereof. The second conductive layer structure 250 may be formed to include a material substantially the same as or different from a material of the conductive layer 122 of the first conductive layer structure 130. In an example embodiment, the second conductive layer structure 250 may include tungsten. The second conductive layer structure 250 may be formed to further include a barrier layer (not shown).

Referring to FIGS. 16 and 17, the second conductive layer structure 250, the preliminary variable resistance element 212 and the preliminary diode 172 may be sequentially etched to form a second opening 270 therethrough exposing an upper surface of the first conductive structure 132.

In example embodiments, the second opening 270 may be formed by a third dry etching process using a second etching mask 260. The third dry etching process may be performed using a proper etching gas according to etching object layers.

In example embodiments, an upper portion of the first conductive structure 132, particularly, an upper portion of the conductive layer pattern 122 may be also removed in the third dry etching process to form a second recess R2 on the first conductive structure 132, and a plurality of protrusions 125 may be formed on the first conductive structure 132 in the first direction.

In example embodiments, the second opening 270 may be formed to extend in the second direction, and a plurality of second openings 270 may be formed in the first direction. Thus, the second conductive layer structure 250, the preliminary variable resistance element 212 and the preliminary diode 172 may be transformed into a second conductive structure 252, a variable resistance element 214 and a diode 174, respectively, and a plurality of second conductive structures 252, a plurality of variable resistance elements 214, and a plurality of diodes 174 may be formed in the first direction. The diode 174 may be formed to include first, second and third semiconductor patterns 144, 154 and 164 sequentially stacked, and the variable resistance element 214 may be formed to include first electrode 184, a variable resistance pattern 194 and a second electrode 204 sequentially stacked.

The diode 174 may serve as a selection element of the variable resistance memory device, and the diode 174 and the variable resistance element 214 may form a memory cell MC. In example embodiments, the memory cell MC may be formed at an intersection at which the first conductive structure 132 and the second conductive structure 252 may cross or overlap each other. As the plurality of first conductive structures 132 and the plurality of second conductive structures 252 may be formed, a plurality of memory cells MCs may be formed both in the first and second directions. The memory cells MCs may be formed on the protrusions 125, respectively, on the first conductive structure 132.

The second insulation layer pattern 240 may be divided into a plurality of pieces in the first direction by the second opening 270.

Figure 18:
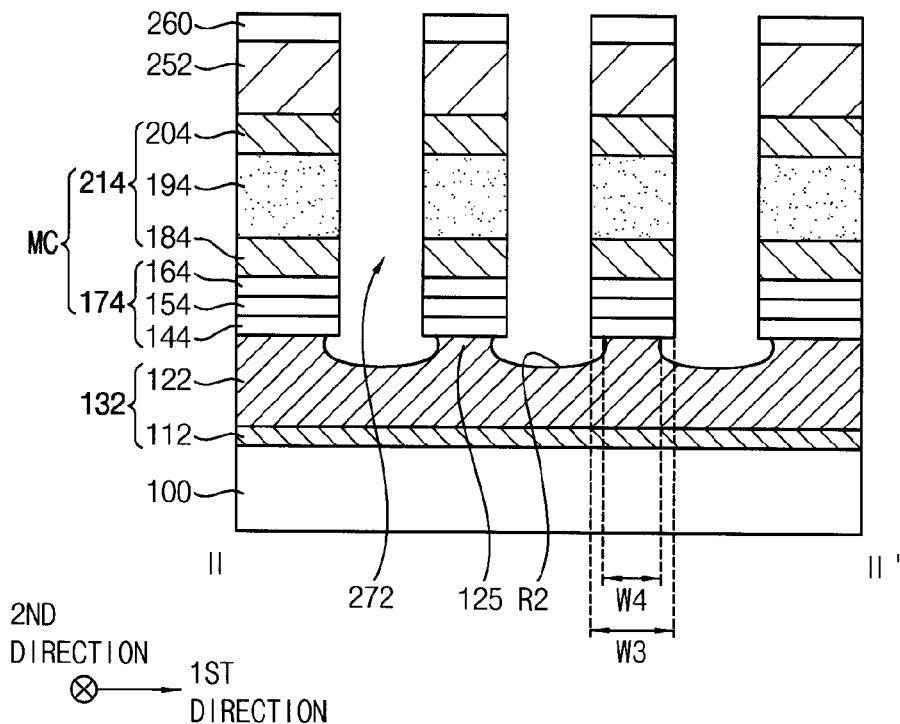

Referring to FIG. 18, a second wet etching process may be performed on the first conductive structure 132 so that a width in the first direction of each of the protrusions 125 on the conductive layer pattern 122 may become less than that of the diode 174, and thus the second recess R2 may be enlarged in the first direction.

As the second wet etching process may be performed, a sidewall of each of the protrusions 125 may be partially removed. Thus, a fourth width W4 in the first direction of a top surface of each of the protrusions 125 may be less than a third width W3 in the first direction of a bottom surface of the diode 174.

As a result, a top surface of each of the protrusions 125 of the first conductive structure 132 contacting the bottom surface of the diode 174 may have a width in each of the first and second directions less than that of the bottom surface of the diode 174, and thus may have an area less than that of the bottom surface of the diode 174.

Figure 19:
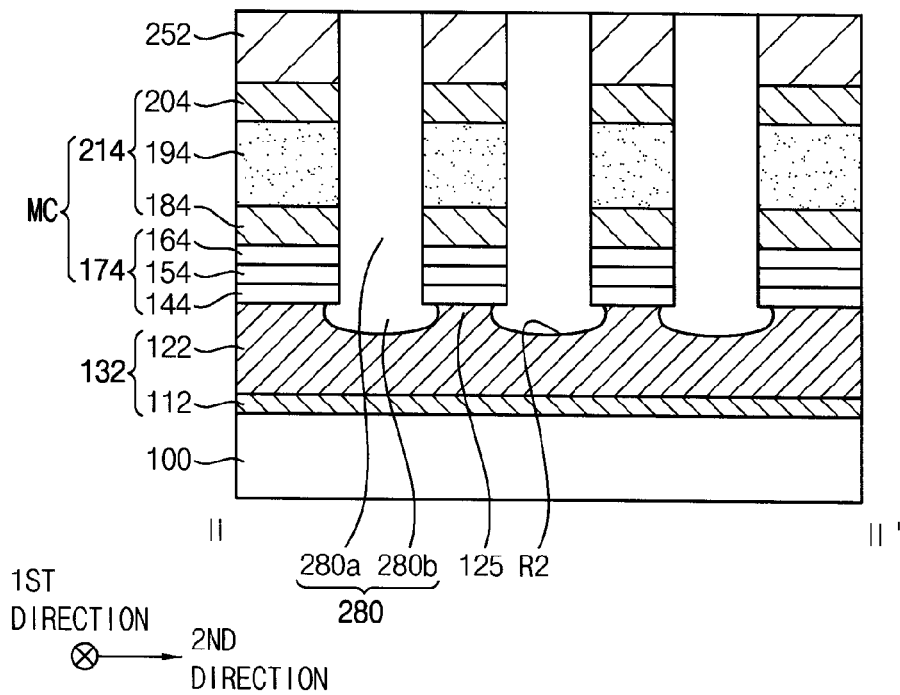

Referring to FIG. 19, after removing the second etching mask 260, a third insulation layer pattern 280 may be formed to fill the second opening 270, and thus the variable resistance memory device may be completed.

The third insulation layer pattern 280 may be formed by forming a third insulation layer on the upper surfaces of the first conductive structures 132 exposed by the second recess R2 and upper surfaces of the second conductive structures 252 to sufficiently fill the second openings 270, and planarizing the third insulation layer until the upper surfaces of the second conductive structures 252 may be exposed. The third insulation layer may be formed to include an oxide, e.g., silicon oxide.

In example embodiments, the third insulation layer pattern 280 may be formed to extend in the second direction, and a plurality of third insulation layer patterns 280 may be formed in the first direction. Each of the third insulation layer patterns 280 may be formed to include an upper portion 280*a* and a lower portion 280*b*. The upper portion 280*a* of the third insulation layer pattern 280 may be formed between neighboring diodes 174 in the first direction, between neighboring variable resistance elements 214 in the first direction and between neighboring second conductive structures 252 in the first direction, and the lower portion 280*b* of the third insulation layer pattern 280 may be formed between neighboring protrusions 125 in the first direction, and may be integrally formed with the upper portion 280*a*. In example embodiments, the lower portion 280*b* of the third insulation layer pattern 280 may have a maximum width in the first direction greater than that of the upper portion 280*a* of the third insulation layer pattern 280.

In example embodiments, the third insulation layer may be formed to include a material substantially the same as that of the second insulation layer, and thus the third insulation layer pattern 280 may be merged into the second insulation layer pattern 240 to form an insulation layer pattern structure. The insulation layer pattern structure may include the second insulation layer pattern 240 extending in the first direction and the third insulation layer pattern 280 extending in the second direction, and the second and third insulation layer patterns 240 and 280 may cross each other.

Figure 20:
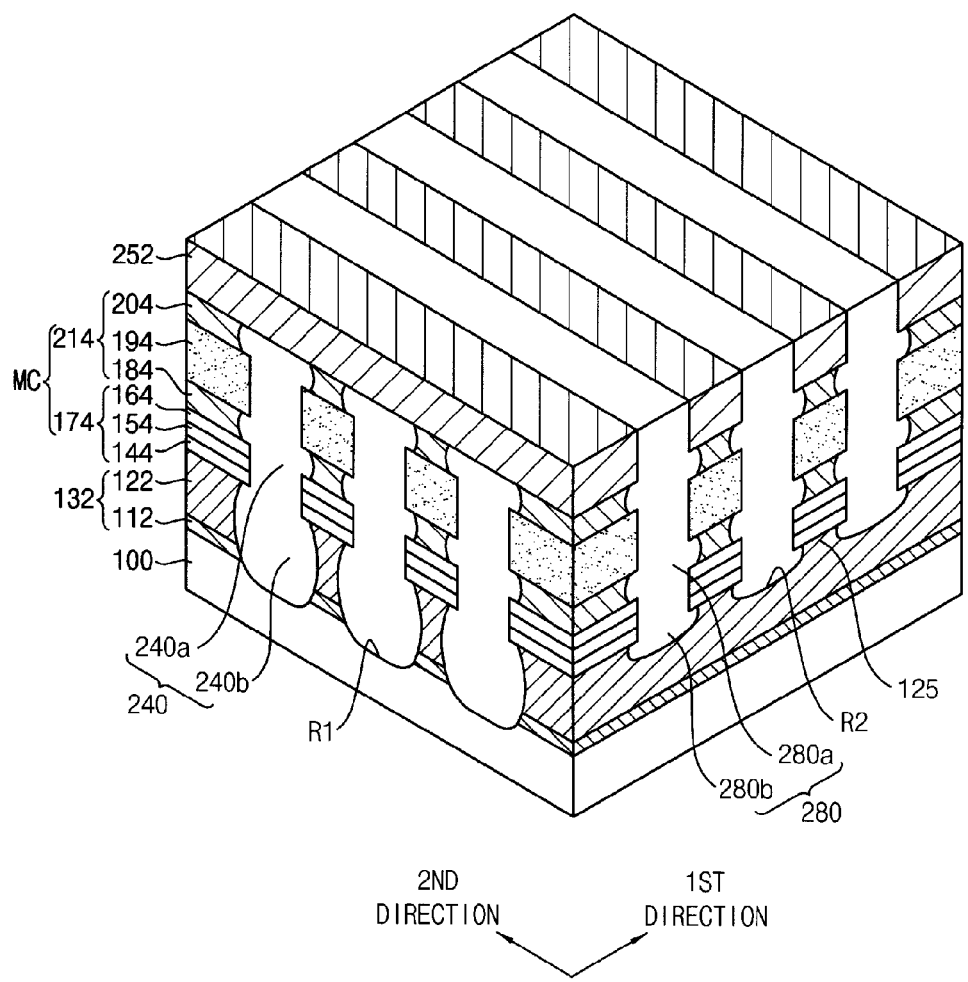
Figure 21:
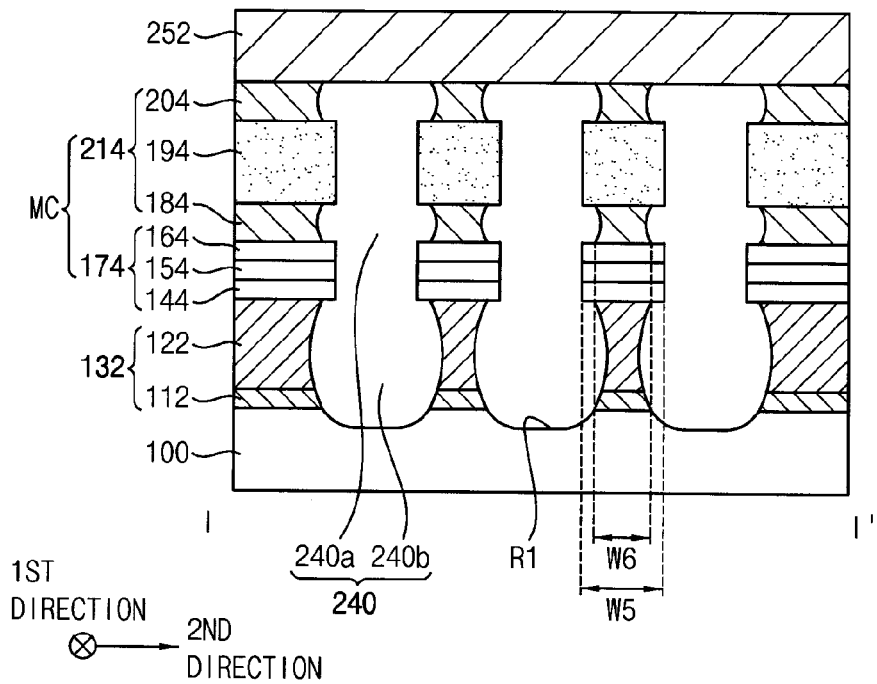
Figure 22:
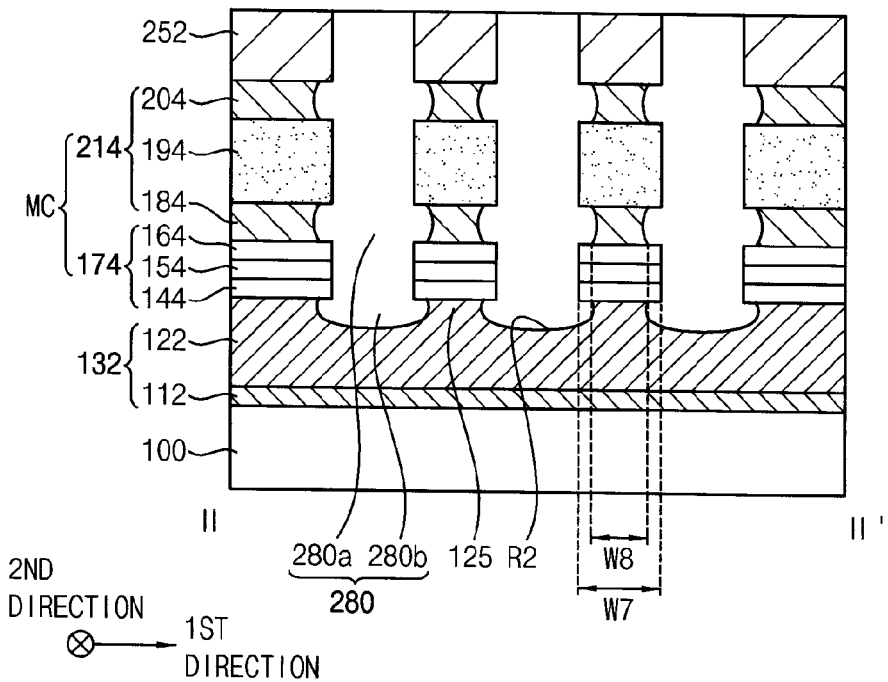

FIG. 20 is a perspective view illustrating a variable resistance memory device in accordance with still other example embodiments, and FIGS. 21 and 22 are cross-sectional views of the variable resistance memory device in FIG. 20. Particularly, FIG. 21 is a cross-sectional view cut along a line I-I' in FIG. 2, and FIG. 22 is a cross-sectional view cut along a line II-II' in FIG. 2.

A variable resistance memory device 50 shown in FIGS. 20 to 22 may be substantially the same as or similar to the variable resistance memory device illustrated with reference to FIGS. 1 to 4, except for the shape of the variable resistance element and the insulation layer pattern structure. Thus, like reference numerals refer to like elements, and detailed descriptions thereon are omitted herein.

Referring to FIGS. 20 to 22, the variable resistance memory device 50 may include a first conductive structure 132, a second conductive structure 252 and a memory cell MC. The variable resistance memory device may further include a first insulation layer 100 and an insulation layer pattern structure.

The memory cell MC may include a selection element 174 and a variable resistance element 214, and the variable resistance element 214 may include a first electrode 184, a variable resistance pattern 194, and a second electrode 204 sequentially stacked.

A bottom surface of the first electrode 184 may have a width in the first and/or second direction less than that of a top surface of the selection element 174. Thus, the bottom surface of the first electrode 184 contacting the top surface of the selection element 174 may have an area less than that of the top surface of the selection element 174, and thus, when a reverse voltage is applied to the selection element 174, a level of a current that may leak through the selection element 174 may decrease more. The first electrode 184 may have a width in the first and/or second direction that may increase from a central portion toward the top or bottom surface.

In example embodiments, when the second electrode 204 includes a material substantially the same as that of the first electrode 184 or having a low etching selectivity with respect to the first electrode 184, the second electrode 204 may have a shape similar to that of the first electrode 184. That is, a bottom surface or a top surface of the second electrode 204 may have a width in the first and/or second direction less than that of the top surface of the selection element 174, and a width in the first and/or second direction of the second electrode 204 may increase from a central portion toward the top or bottom surface.

In some example embodiments, each of the first and second electrodes 184 and 204 may be formed to have a width in the second direction that may be substantially constant along the vertical direction.

In example embodiments, when the second electrode 204 is formed to include a material different from that of the first electrode 184, particularly, a material having a high etching selectivity with respect to the first electrode 184, unlike the first electrode 184, the bottom surface or the top surface of the second electrode 204 may have an area substantially the same as that of the selection element 174.

The variable resistance memory device illustrated with reference to FIGS. 20 to 22 may be manufactured by processes substantially the same as or similar to those illustrated with reference to FIGS. 8 to 19.

However, when the first wet etching process is performed on the first conductive structure 132 as illustrated with reference to FIG. 11, an additional wet etching process may be further performed on the preliminary first electrode 182, and when the second wet etching process is performed on the first conductive structure 132 as illustrated with reference to FIG. 18, an additional wet etching process may be further performed on the first electrode 184.

When the second electrode 204 is formed to include a material substantially the same as or having a low etching selectivity with respect to that of the first electrode 184, the preliminary second electrode 202 or the second electrode 204 may be also etched during the wet etching process on the preliminary first electrode 182 or the first electrode 184, and thus the second electrode 204 may be formed to have a shape similar to that of the first electrode 184.

Alternatively, when the second dry etching process is performed on the first conductive structure 132 as illustrated with reference to FIGS. 13 and 24, an additional dry etching process may be further performed on the preliminary first electrode 182 and/or the preliminary second electrode 202, and in this case, each of the first and second electrodes 184 and 204 may be formed to have a width in the second direction substantially constant in the vertical direction.

Figure 23:
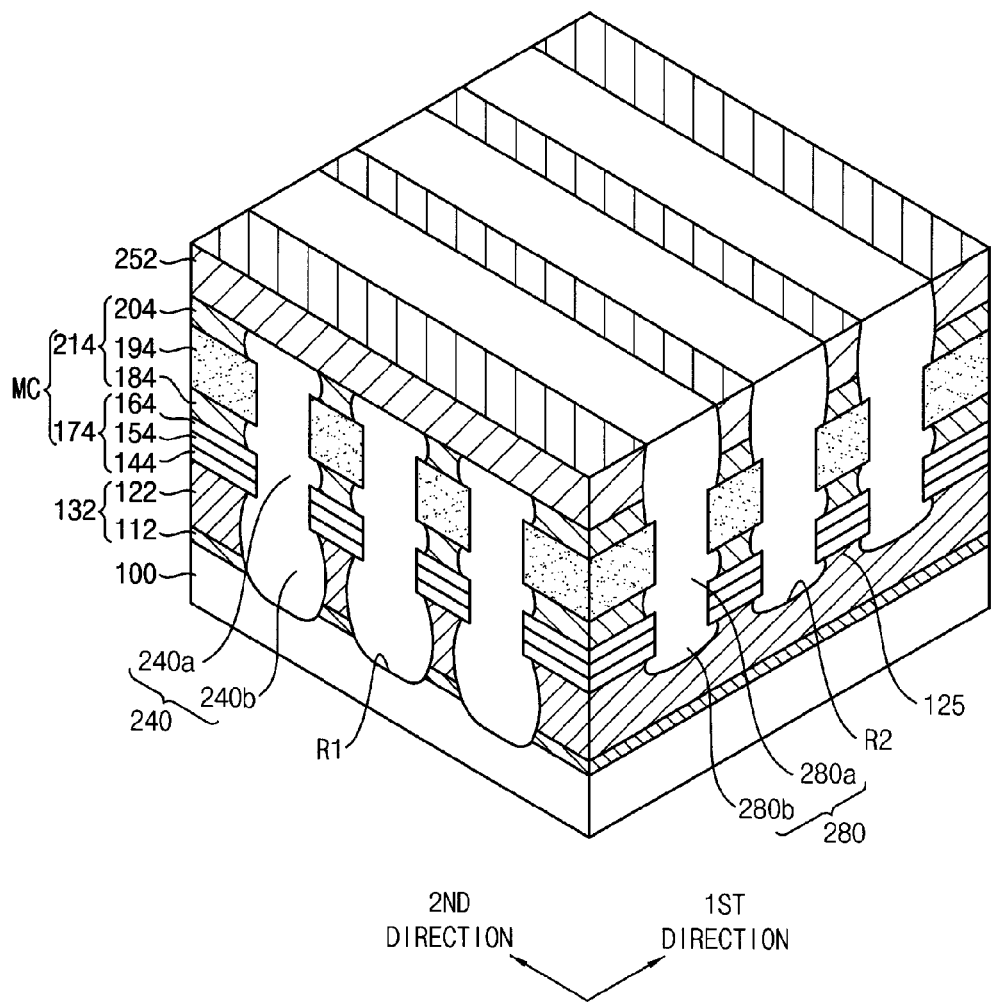
Figure 24:
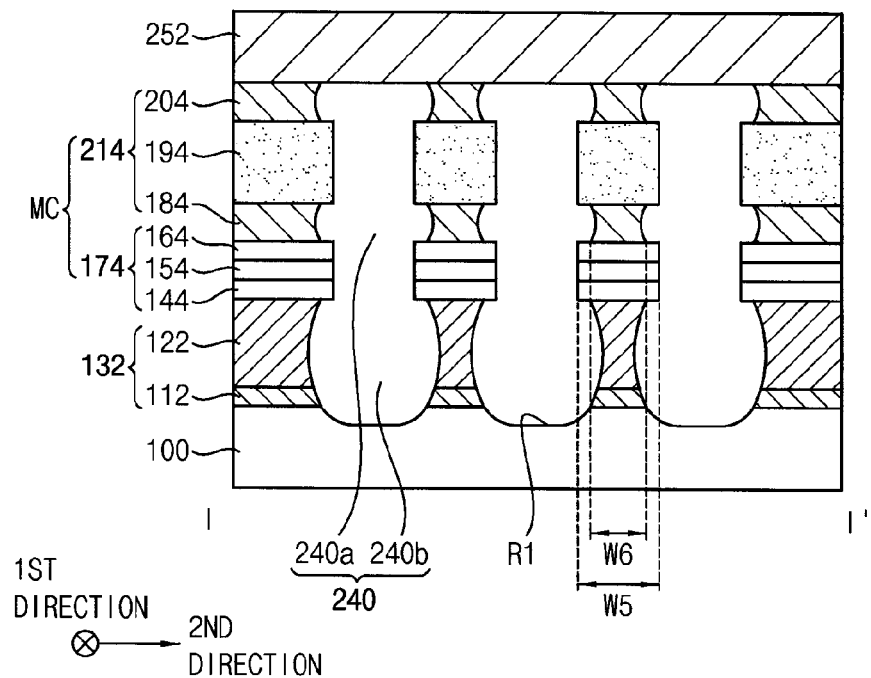
Figure 25:
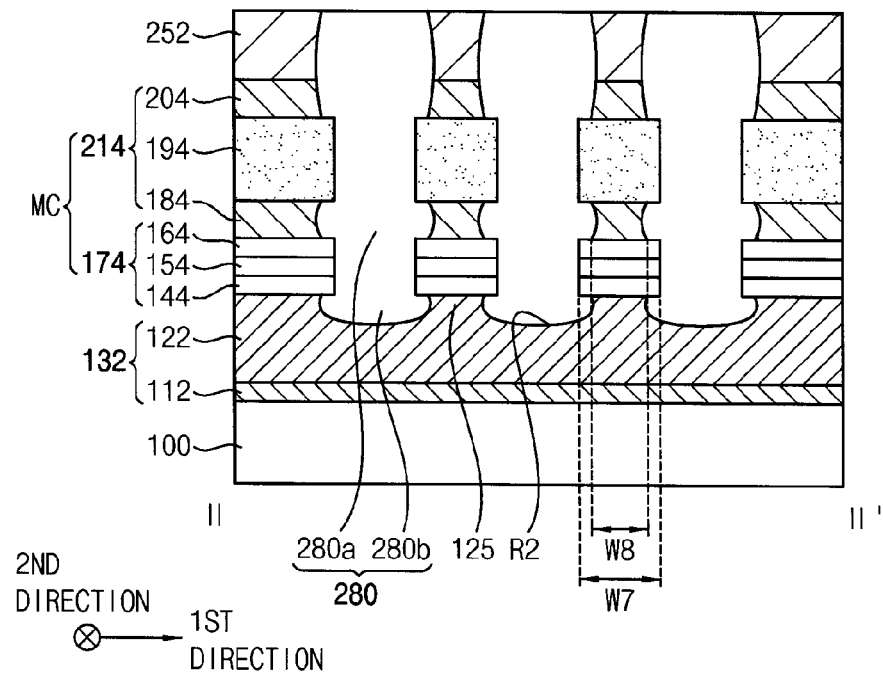

FIG. 23 is a perspective view illustrating a variable resistance memory device in accordance with yet other example embodiments, and FIGS. 24 and 25 are cross-sectional views of the variable resistance memory device in FIG. 23. Particularly, FIG. 24 is a cross-sectional view cut along a line I-I' in FIG. 2, and FIG. 25 is a cross-sectional view cut along a line II-II' in FIG. 2.

A variable resistance memory device 60 shown in FIGS. 23 to 25 may be substantially the same as or similar to the variable resistance memory device illustrated with reference to FIGS. 20 to 22, except for the shape of the second conductive structure. Thus, like reference numerals refer to like elements, and detailed descriptions thereon are omitted herein.

Referring to FIGS. 23 to 25, the variable resistance memory device 60 may include a first conductive structure 132, a second conductive structure 252 and a memory cell MC. The variable resistance memory device 60 may further include a first insulation layer 100 and an insulation layer pattern structure.

In example embodiments, when the second conductive structure 252 is formed to include a material substantially the same as or having a low etching selectivity with respect to the first conductive structure 132 and/or the first electrode 184, the second conductive structure 252 may be formed to have a width in the first direction less than that of the variable resistance pattern 194. The second conductive structure 252 may have a width in the first direction that may gradually increase from a central portion toward an upper or lower surface, or substantially constant in the vertical direction.

The variable resistance memory device 60 illustrated with reference to FIGS. 23 to 25 may be manufactured by processes substantially the same as or similar to those illustrated with reference to FIGS. 20 to 22.

However, when the second wet etching process is performed on the first conductive structure 132 or the first electrode 184, the second conductive structure 252 may be also etched, and thus the second conductive structure 252 may be formed to have a width in the first direction less than that of the variable resistance pattern 194. Alternatively, when the second dry etching process is performed on the first conductive structure 132 or the first electrode 184, an additional dry etching process may be further performed on the second conductive structure 252, and thus the second conductive structure 252 may be formed to have a width in the second direction substantially constant in the vertical direction.

Figure 26:
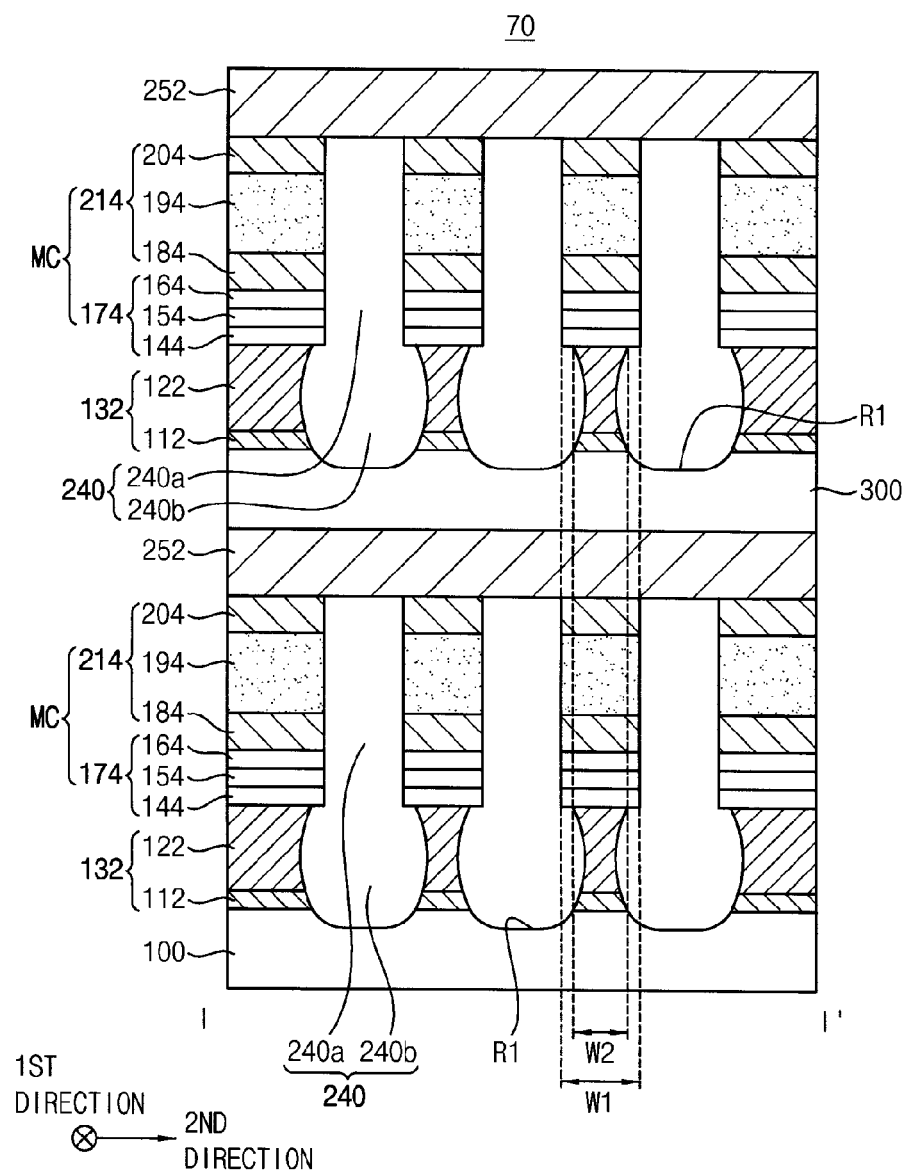
Figure 27:
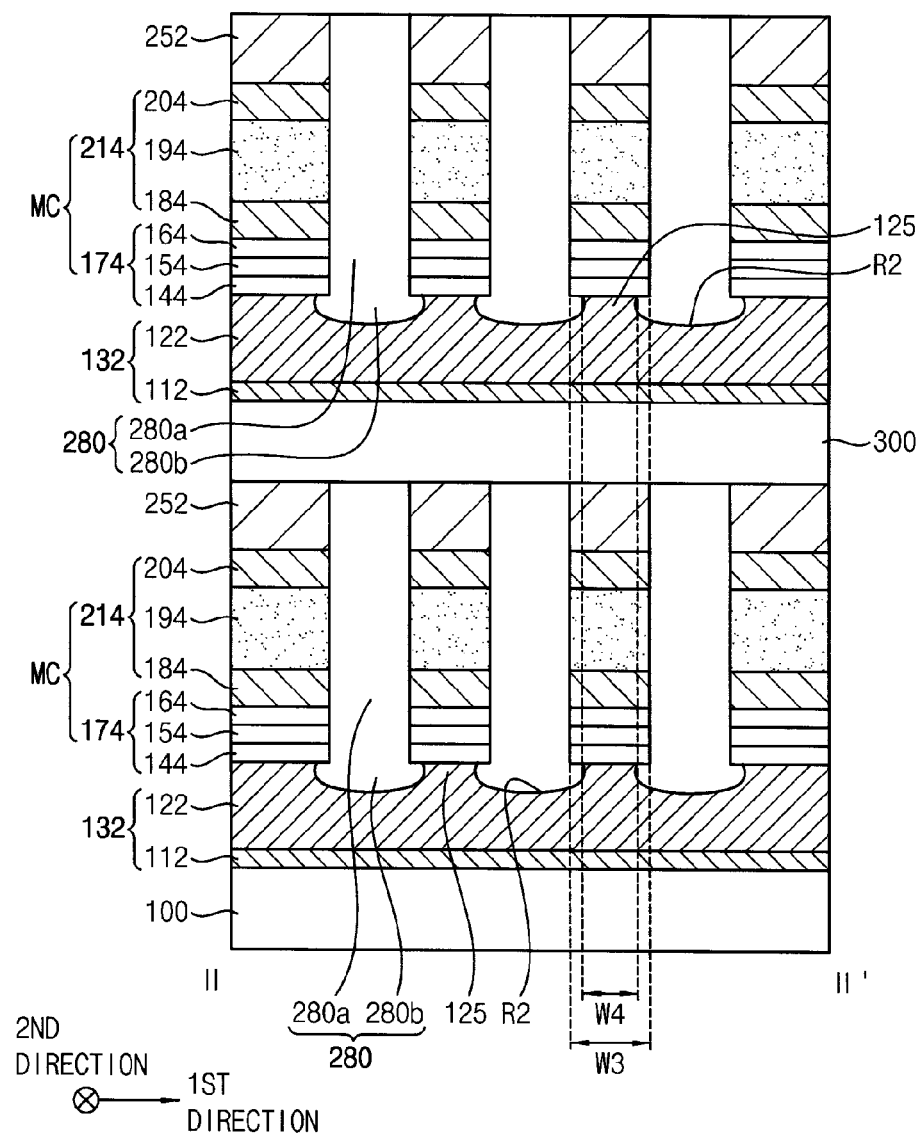

FIGS. 26 and 27 are cross-sectional views illustrating a stacked variable resistance memory device 70 in accordance with example embodiments. Particularly, FIG. 26 is a cross-sectional view cut along a line I-I' in FIG. 2, and FIG. 27 is a cross-sectional view cut along a line II-II' in FIG. 2. The stacked variable resistance memory device shown in FIGS. 26 and 27 may include two variable resistance memory devices illustrated with reference to FIGS. 1 to 4 sequentially stacked. Thus, like reference numerals refer to like elements, and detailed descriptions thereon are omitted herein.

Referring to FIGS. 26 and 27, a stacked variable resistance memory device 70 may include a first variable resistance memory device and a second variable resistance memory device.

In example embodiments, each of the first and second variable resistance memory devices may be substantially the same as or similar to that illustrated with reference to FIGS. 1 to 4. An insulating interlayer 300 may be formed between the first and second variable resistance memory devices. The second insulation layer pattern 240 of the second variable resistance memory device may extend through an upper portion of the insulating interlayer 300, and may be surrounded by the insulating interlayer 300.

In each of the first and second variable resistance memory devices, the upper surface of the first conductive structure 132 contacting the bottom surface of the selection element 174 may have an area less than that of the bottom surface of the selection element 174, and thus, when a reverse voltage is applied to the selection element 174, a level of a current that may leak through the selection element 174 may decrease. Accordingly, the stacked variable resistance memory device including the first and second variable resistance memory devices sequentially stacked may have good electrical characteristics.

FIGS. 26 and 27 illustrate the stacked variable resistance memory device 70 including two stacked variable resistance memory devices, however, the stacked variable resistance memory device may include more than two variable resistance memory devices sequentially stacked. FIGS. 26 and 27 illustrate the stacked variable resistance memory device 70 including the variable resistance memory devices shown in FIGS. 1 to 4, however, the stacked variable resistance memory device 70 may also include variable resistance memory devices shown in FIGS. 5 to 7, FIGS. 20 to 22, or FIGS. 23 to 25.

Figure 28:
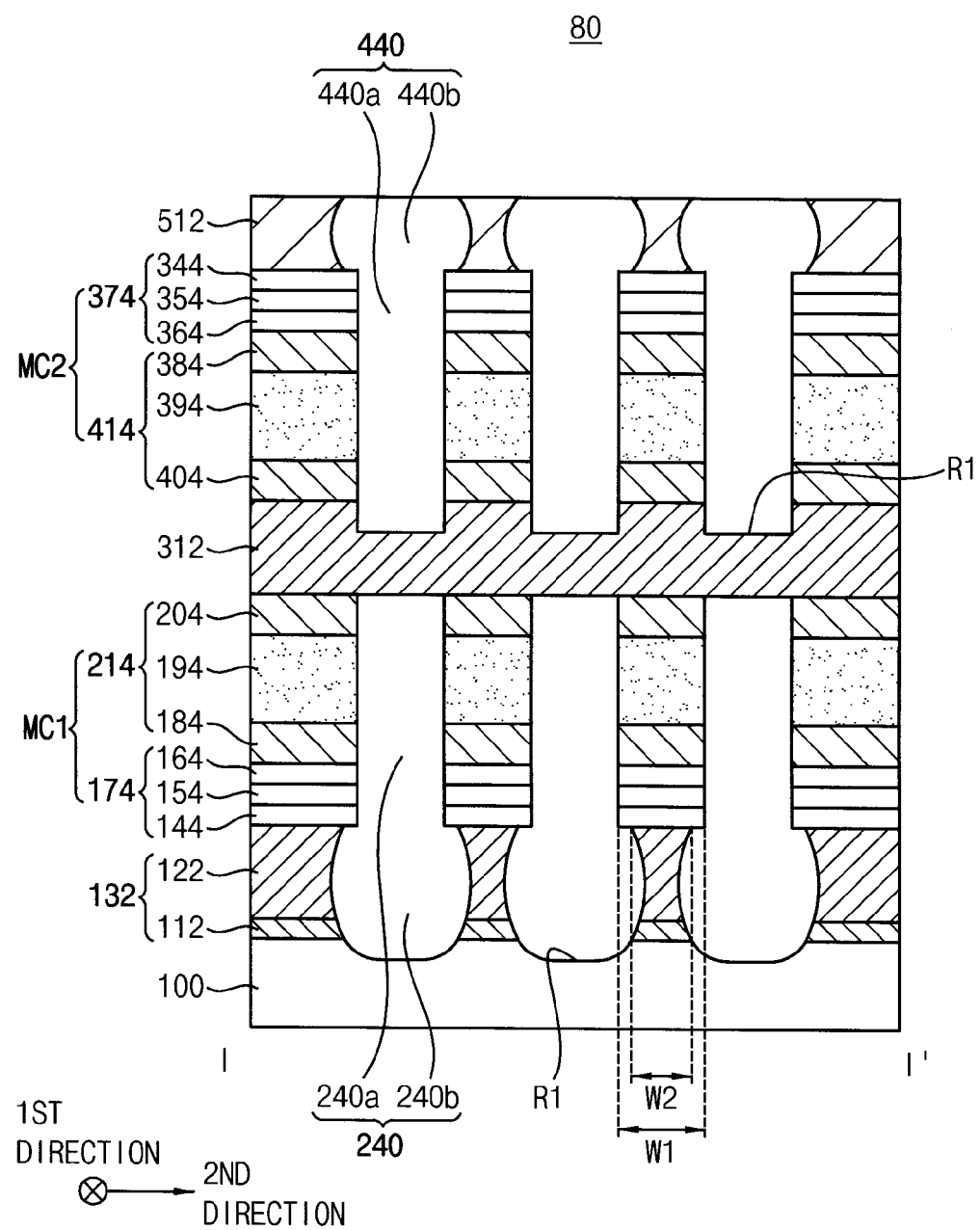
Figure 29:
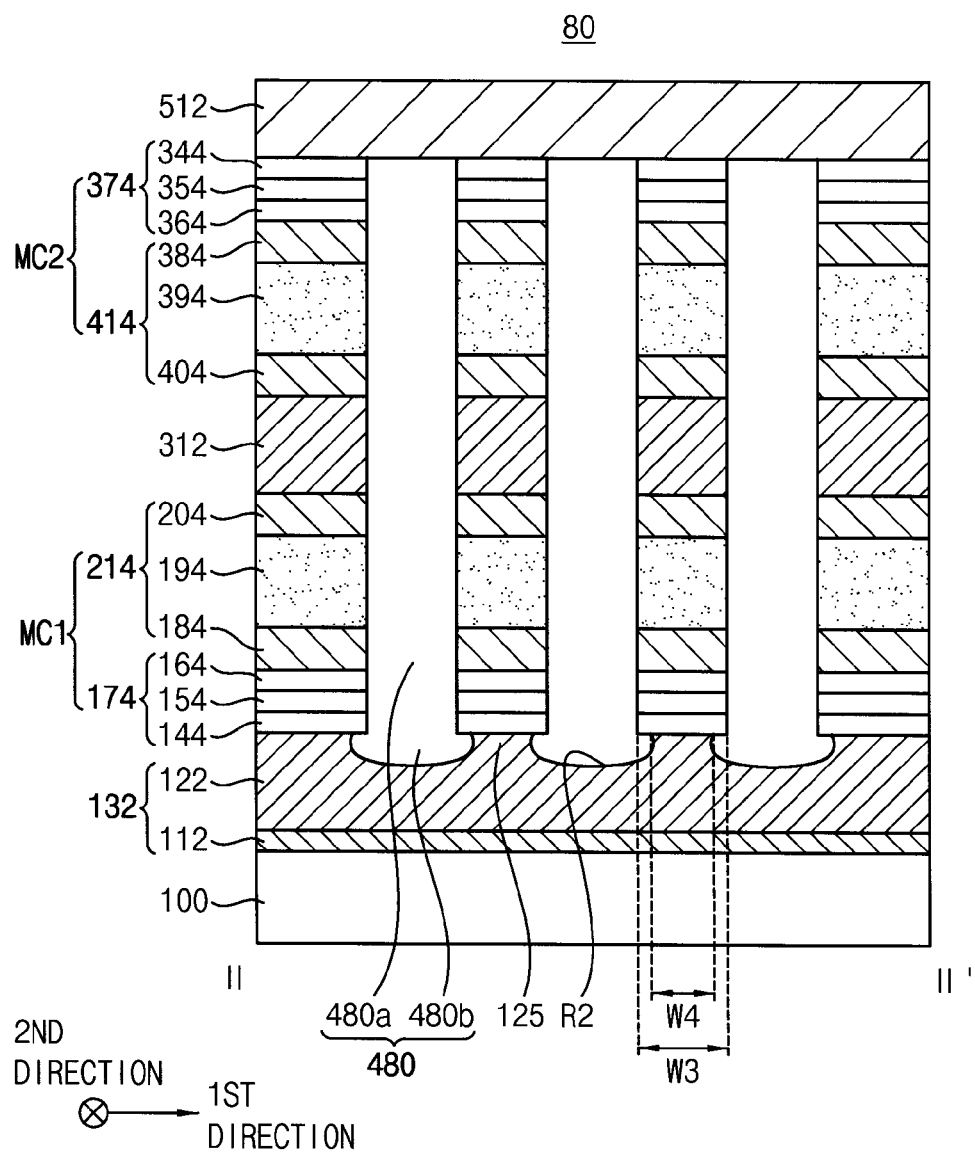

FIGS. 28 and 29 are cross-sectional views illustrating a stacked variable resistance memory device in accordance with other example embodiments. Particularly, FIG. 28 is a cross-sectional view cut along a line I-I' in FIG. 2, and FIG. 29 is a cross-sectional view cut along a line II-II' in FIG. 2.

A stacked variable resistance memory device 80 shown in FIGS. 28 and 29 may include the variable resistance memory device illustrated with reference to FIGS. 1 to 4. Thus, like reference numerals refer to like elements, and detailed descriptions thereon are omitted herein.

Referring to FIGS. 28 and 29, the stacked variable resistance memory device 80 may include first, second and third conductive structures 132, 312 and 512, and first and second memory cells MC1 and MC2. The stacked variable resistance memory device 80 may further include a first insulation layer 100 and an insulation layer pattern structure.

In example embodiments, the first conductive structure 132 may extend in the first direction, and a plurality of first conductive structures 132 may be formed in the second direction. The first conductive structure 132 may include a barrier layer pattern 112 and a conductive layer pattern 122 sequentially stacked. The second conductive structure 312 may extend in the second direction over the first conductive structure 132, and a plurality of second conductive structures 312 may be formed in the first direction. The third conductive structure 512 may extend in the first direction over the second conductive structure 312, and a plurality of third conductive structures 512 may be formed in the second direction. Thus, the first and third conductive structures 132 and 512 may extend in substantially the same direction, and the second conductive structure 312 may be disposed between the first and third conductive structures 132 and 512 and extend in a direction to cross the first and third conductive structures 132 and 512.

A first memory cell MC1 may be formed at an intersection at which the first and second conductive structures 132 and 312 may cross each other, and a second memory cell MC2 may be formed at an intersection at which the second and third conductive structures 312 and 512 may cross each other.

In example embodiments, the first and third conductive structures 132 and 512 may serve as a bit line of the stacked variable resistance memory device, and the second conductive structure 312 may serve as a common word line of the stacked variable resistance memory device. Alternatively, the first and third conductive structures 132 and 512 may serve as a word line of the stacked variable resistance memory device, and the second conductive structure 312 may serve as a common bit line of the stacked variable resistance memory device.

As a plurality of first conductive structures 132, a plurality of second conductive structures 312 and a plurality of third conductive structures 512 may be formed, a plurality of first memory cells MC1s and a plurality of second memory cells MC2s may be formed to define first and second memory cell arrays, respectively.

In example embodiments, the first memory cell MC1 may include a first selection element 174 and a first variable resistance element 214 sequentially stacked on the first conductive structure 132. The first selection element 174 may include first, second and third semiconductor patterns 144, 154 and 164 sequentially stacked, and the first variable resistance element 214 may include a first electrode 184, a first variable resistance pattern 194 and a second electrode 204 sequentially stacked.

In example embodiments, the second memory cell MC2 may include a second variable resistance element 414 and a second selection element 374 sequentially stacked on the second conductive structure 312. The second variable resistance element 414 may include a fourth electrode 404, a second variable resistance pattern 394 and a third electrode 384 sequentially stacked. The second selection element 374 may include sixth, fifth and fourth semiconductor patterns 364, 354 and 344 sequentially stacked.

The insulation layer pattern structure may include a second insulation layer pattern 240, a fourth insulation layer pattern 440 and a common insulation layer pattern 480.

The second insulation layer pattern 240 may extend in the first direction, and may include an upper portion 240a and a lower portion 240b. The upper portion 240a of the second insulation layer pattern 240 may be formed between the first memory cells MC1s adjacent to each other in the second direction, and the lower portion 240b of the second insulation layer pattern 240, which may be formed integrally with the upper portion 240a, may be formed between the first conductive structures 132 adjacent to each other in the second direction. In example embodiments, the lower portion 240b of the second insulation layer pattern 240 may have a maximum width in the second direction greater than that of the upper portion 240a of the second insulation layer pattern 240.

The fourth insulation layer pattern 440 may extend in the first direction, and may include a lower portion 440a and an upper portion 440b. The lower portion 440a of the fourth insulation layer pattern 440 may be formed between the second memory cells MC2s adjacent to each other in the second direction, and the upper portion 440b of the fourth insulation layer pattern 440, which may be formed integrally with the lower portion 440a, may be formed between the third conductive structures 512 adjacent to each other in the second direction. In example embodiments, the upper portion 440b of the fourth insulation layer pattern 440 may have a maximum width in the second direction greater than that of the lower portion 440a of the fourth insulation layer pattern 440. The lower portion 440a of the fourth insulation layer pattern 440 may extend through an upper portion of the second conductive structure 312.

The common insulation layer pattern 480 may extend in the second direction, and may include an upper portion 480a and a lower portion 480b. The upper portion 480a of the common insulation layer pattern 480 may be formed between the first memory cells MC1s adjacent to each other in the first direction, between the second conductive structures 312 adjacent to each other in the first direction and between the second memory cells MC2s adjacent to each other in the first direction, and the lower portion 480b of the common insulation layer pattern 480, which may be formed integrally with the upper portion 480b, may be formed between the first conductive structures 132 adjacent to each other in the first direction. In example embodiments, the lower portion 480b of the common insulation layer pattern 480 may have a maximum width in the first direction greater than that of the upper portion 480a of the common insulation layer pattern 480.

In example embodiments, the second insulation layer pattern 240 and the common insulation layer pattern 480 may cross each other, and the fourth insulation layer pattern 440 and the common insulation layer pattern 480 may cross each other. The second and fourth insulation layer patterns 240 and 440 and the common insulation layer pattern 480 may include an oxide, e.g., silicon oxide. In example embodiments, the second and fourth insulation layer patterns 240 and 440 and the common insulation layer pattern 480 may include substantially the same material, and thus may be integrally formed.

In the stacked variable resistance memory device, the upper surface of the first conductive structure 132 contacting the bottom surface of the first selection element 174 may have an area less than that of the bottom surface of the first selection element 174, and thus, when a reverse voltage is applied to the first selection element 174, a level of a current that may leak through the first selection element 174 before approaching the breakdown voltage may decrease. Additionally, the lower surface of the third conductive structure 512 contacting the top surface of the second selection element 374 may have an area less than that of the top surface of the second selection element 374, and thus, when a reverse voltage is applied to the second selection element 374, a level of a current that may leak through the second selection element 374 before approaching the breakdown voltage may decrease. Accordingly, the stacked variable resistance memory device may have good electrical characteristics.

Figure 30:
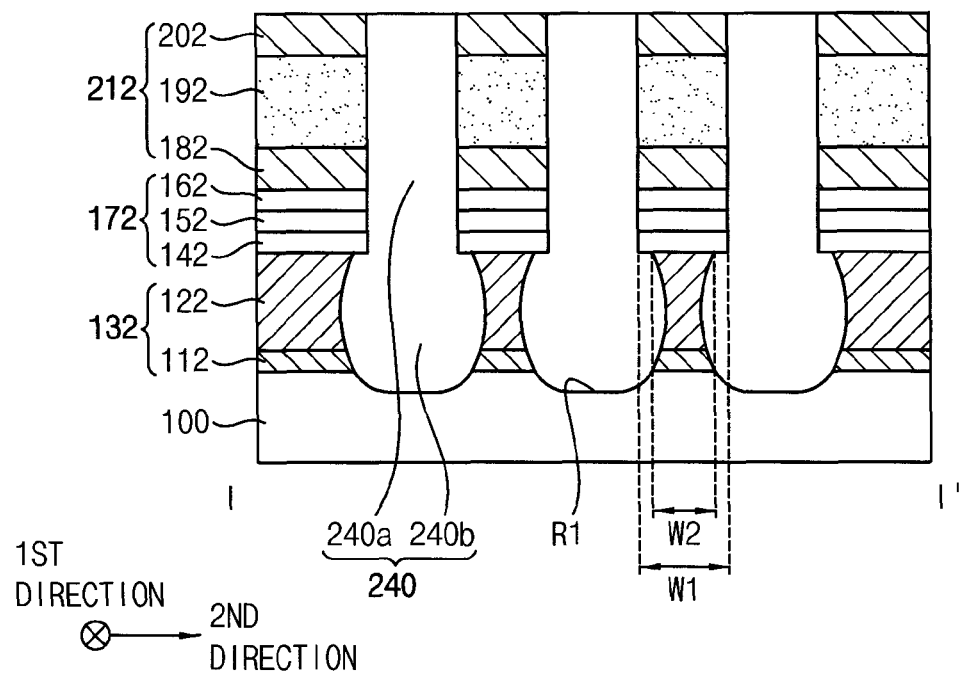
Figure 31:
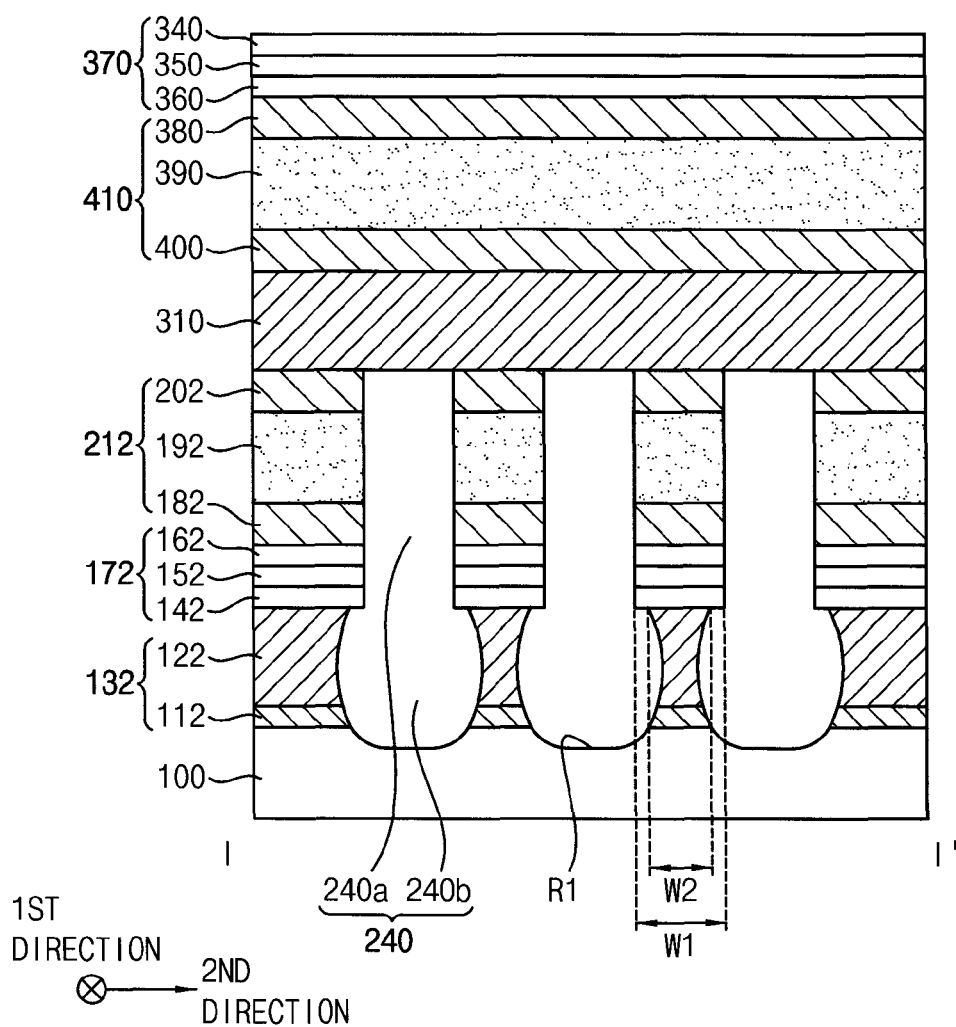
Figure 32:
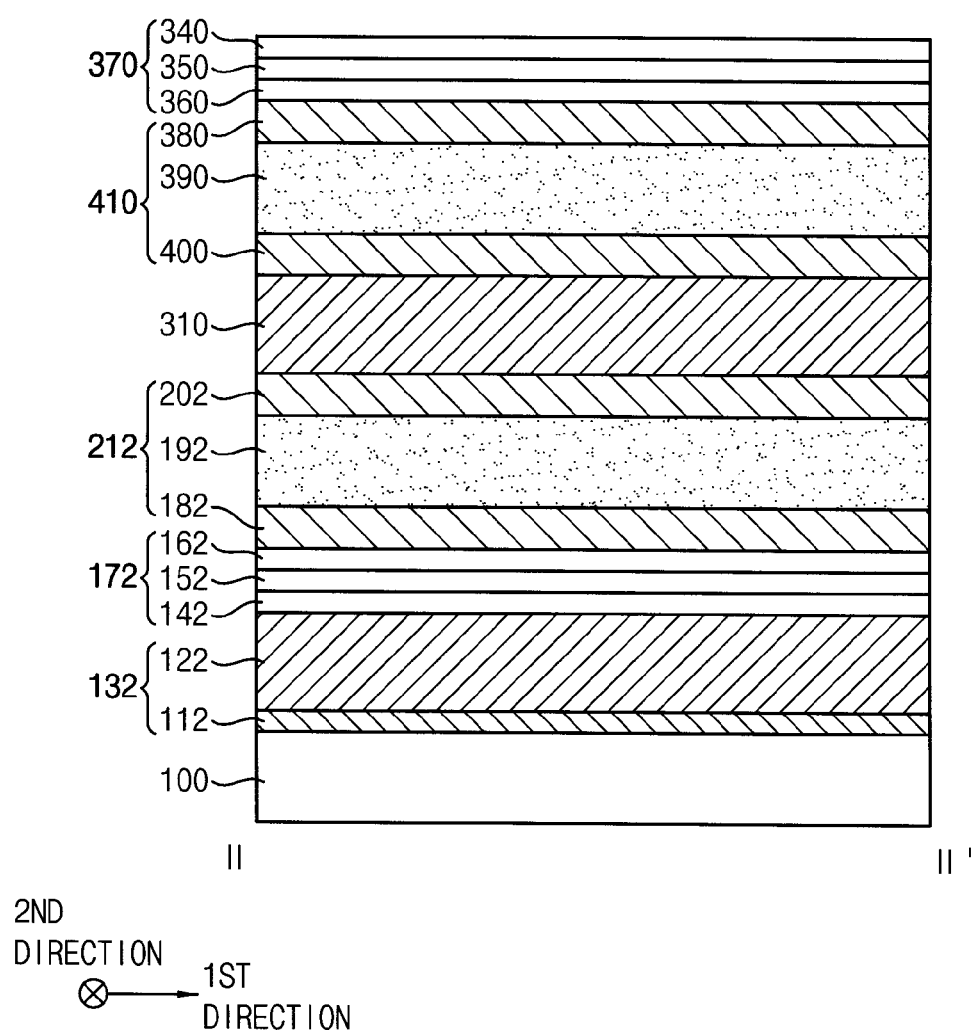
Figure 33:
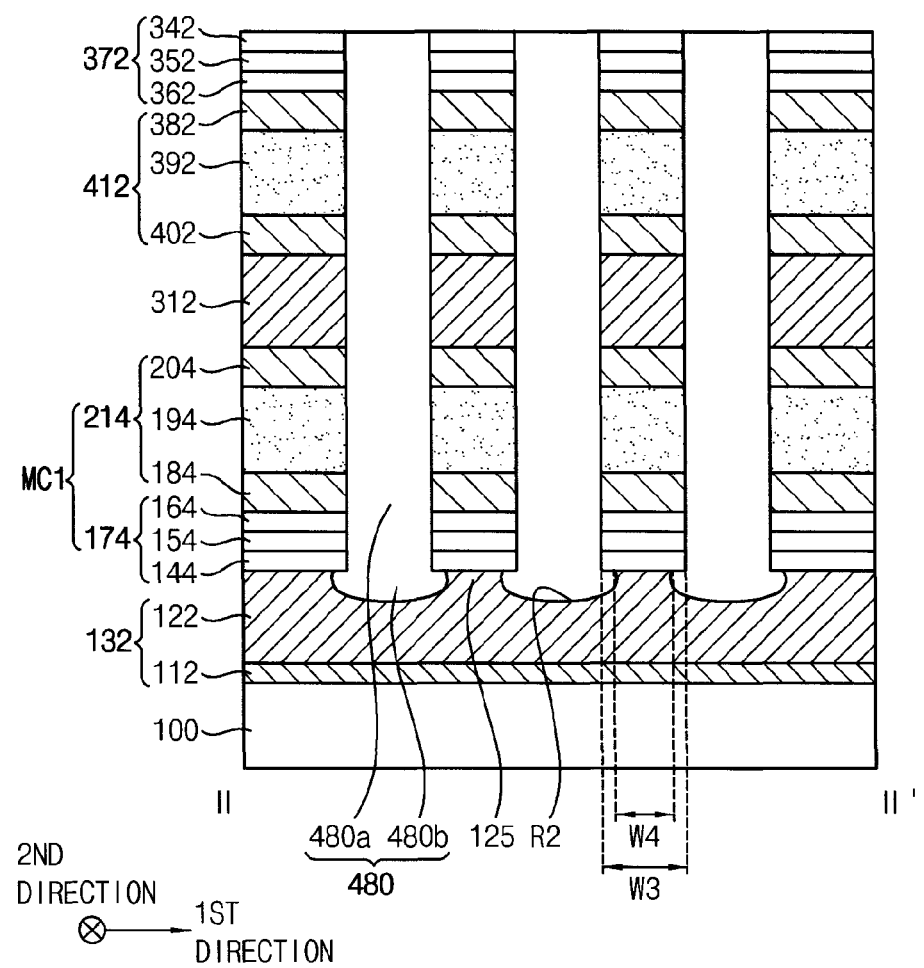

FIGS. 30 to 33 are cross-sectional views illustrating stages of a method of manufacturing a stacked variable resistance memory device in accordance with some example embodiments. Particularly, FIGS. 30 and 31 are cross-sectional views cut along a line I-I' in FIG. 2, and FIGS. 32 and 33 are cross-sectional views cut along a line II-II' in FIG. 2.

Referring to FIG. 30, processes substantially the same as or similar to those illustrated with reference to FIGS. 8 to 15 may be performed. However, the second conductive layer structure 250 may not be formed.

Thus, a first conductive layer structure 132, a preliminary first diode 172, a preliminary first variable resistance element 212 and a second insulation layer pattern 240 may be formed.

Referring to FIGS. 31 and 32, a second conductive layer structure 310, a second variable resistance layer structure 410 and a second diode layer structure 370 may be sequentially formed on the preliminary variable resistance elements 212 and the second insulation layer patterns 240.

In example embodiments, the second variable resistance layer structure 410 may be formed to include a fourth electrode layer 400, a second variable resistance layer 390 and a third electrode layer 380 sequentially stacked, and the second diode layer structure 370 may be formed to include sixth, fifth and fourth semiconductor layers 360, 350 and 340 sequentially stacked. In example embodiments, the fourth semiconductor layer 340 may be formed to include a semiconductor material doped with p-type impurities, the sixth semiconductor layer 360 may be formed to include a semiconductor material doped with n-type impurities, and the fifth semiconductor layer 350 may be formed to include an undoped semiconductor material.

Referring to FIG. 33, the second diode layer structure 370, the second variable resistance layer structure 410, the second conductive layer structure 310, the preliminary first variable resistance element 212 and the preliminary first diode 172 may be sequentially etched to form a third opening (not shown) therethrough exposing an upper surface of the first conductive structure 132.

In example embodiments, the third opening may be formed by a dry etching process, and an upper portion of the conductive layer pattern 122 of the first conductive structure 132 may be also removed in the dry etching process to form a second recess R2 on the first conductive structure 132. Thus, a plurality of protrusions 125 may be formed on the first conductive structure 132 in the first direction.

In example embodiments, the third opening may be formed to extend in the second direction, and a plurality of third openings may be formed in the first direction. Thus, the second diode layer structure 370, the second variable resistance layer structure 410, the second conductive layer structure 310, the preliminary first variable resistance element 212 and the preliminary first diode 172 may be transformed into a preliminary second diode 372, a preliminary second variable resistance element 412, a second conductive structure 312, a first variable resistance element 214 and a first diode 174, respectively. a plurality of preliminary second diodes 372, a plurality of preliminary second variable resistance elements 412, and a plurality of second conductive structures 312 may be formed in the first direction, and a plurality of first variable resistance elements 214 and a plurality of first diodes 174 may be formed both in the first and second directions.

The first diode 174 may be formed to include first, second and third semiconductor patterns 144, 154 and 164 sequentially stacked, the first variable resistance element 214 may be formed to include first electrode 184, a first variable resistance pattern 194 and a second electrode 204 sequentially stacked, the preliminary second variable resistance element 412 may be formed to include a preliminary fourth electrode 402, a preliminary second variable resistance pattern 392 and a preliminary third electrode 382 sequentially stacked, and the preliminary second diode 372 may be formed to include a preliminary sixth semiconductor pattern 362, a preliminary fifth semiconductor pattern 352 and a preliminary fourth semiconductor pattern 342 sequentially stacked.

A wet etching process may be further performed on the protrusions 125 of the first conductive structure 132 so that a fourth width W4 in the first direction of each of the protrusions 125 may be less than a third width W3 in the first direction of the first diode 174.

A common insulation layer pattern 480 may be formed to fill the third opening.

Referring to FIGS. 28 and 29 again, after forming a third conductive layer structure on the preliminary second diodes 372 and the common insulation layer patterns 480, the third conductive layer structure, the preliminary second diode 372 and the preliminary second variable resistance element 412 may be sequentially etched to form a fourth opening (not shown) exposing an upper surface of the second conductive structure 312.

In example embodiments, the fourth opening may be formed by a dry etching process. In the dry etching process, an upper portion of the second conductive structure may be also removed to form a third recess R3 on the second conductive structure.

In example embodiments, the fourth opening may be formed to extend in the first direction, and a plurality of fourth openings may be formed in the second direction. Thus, the third conductive layer structure, the preliminary second diode 372 and the preliminary second variable resistance element 412 may be transformed into a third conductive structure 512, a second diode 374 and a second variable resistance element 414, respectively. A plurality of third conductive structures 512, a plurality of second diodes 374, and a plurality of second variable resistance elements 414 may be formed both in the first and second directions. The second diode 374 may be formed to include sixth, fifth and fourth semiconductor patterns 364, 354 and 344, respectively, and the second variable resistance element 414 may be formed to include a fourth electrode 404, a second variable resistance pattern 394 and a third electrode 384 sequentially stacked.

A wet etching process may be further performed on a sidewall of the third conductive structure 512 so that the third conductive structure 512 may have a width in the second direction less than a width in the first direction of the second diode 374.

A fourth insulation layer pattern 440 may be formed to fill the fourth opening to complete the stacked variable resistance memory device.

The variable resistance memory device and the method of manufacturing the same may be applied to various types of memory devices including a diode as a selection element and having a cross-point array structure. That is, the variable resistance memory device and the method of manufacturing the same may be applied to, e.g., ReRAM device, PRAM device, MRAM device, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings of the present inventive concepts. Accordingly, all such modifications are intended to be included within the scope of the present inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:
1. A variable resistance memory device, comprising:
  a plurality of first conductive structures extending in a first direction;
  a plurality of second conductive structures over the first conductive structures, the second conductive structures extending in a second direction crossing the first direction; and
  a plurality of memory cells, each including a selection element and a variable resistance element sequentially stacked, the memory cells being formed at intersections at which the first conductive structures and the second conductive structures overlap each other,
  wherein an upper surface of each of the first conductive structures has a width in the second direction less than a width in the second direction of a bottom surface of each of the selection elements, and each of the first conductive structure includes a plurality of protrusions in the first direction, the selection elements each being on a respective one of the plurality of protrusions.

2. The variable resistance memory device of claim 1, wherein each of the protrusions contacts the bottom surface of each of the selection elements.

3. The variable resistance memory device of claim 2, wherein each of the protrusions has a width in the first direction less than a width in the first direction of the bottom surface of each of the selection elements.

4. The variable resistance memory device of claim 1, wherein upper and lower surfaces of each of the first conductive structures have widths in the second direction greater than a width in the second direction of a central portion thereof.

5. The variable resistance memory device of claim 1, wherein each of the first conductive structures has a width in the second direction substantially constant in a vertical direction.

6. The variable resistance memory device of claim 1, wherein each of the first conductive structures includes a barrier layer pattern and a conductive layer pattern sequentially stacked.

7. The variable resistance memory device of claim 6, wherein a top surface of the barrier layer pattern has a width in the second direction greater than a width in the second direction of a bottom surface of the conductive layer pattern.

8. The variable resistance memory device of claim 6, wherein a top surface of the barrier layer pattern has a width in the second direction substantially the same as a width in the second direction of a bottom surface of the conductive layer pattern.

9. The variable resistance memory device of claim 1, wherein each of the selection elements includes first, second and third semiconductor patterns sequentially stacked.

10. The variable resistance memory device of claim 9, wherein the first and third semiconductor patterns are doped with different types of impurities, and the second semiconductor pattern is not doped with impurities.

11. A variable resistance memory device, comprising:
a first conductive structure having a protrusion thereon;
a diode contacting a top surface of the protrusion, a bottom surface of the diode having an area greater than the top surface of the protrusion;
a variable resistance element including a first electrode, a variable resistance pattern and a second electrode sequentially stacked on the diode; and
a second conductive structure on the variable resistance element.

12. The variable resistance memory device of claim 11, wherein the first conductive structure extends in a first direction, and the second conductive structure extends in a second direction that is not parallel to the first direction.

13. The variable resistance memory device of claim 12, wherein the top surface of the protrusion has a width in the second direction less than a width in the second direction of the bottom surface of the diode.

14. The variable resistance memory device of claim 12, wherein the top surface of the protrusion has a width in the first direction less than a width in the first direction of the bottom surface of the diode.

15. The variable resistance memory device of claim 12, wherein the first conductive structure includes a plurality of protrusions in the first direction, and
wherein the variable resistance memory device includes a plurality of diodes in the first direction and a plurality of variable resistance elements in the first direction.

16. A variable resistance memory device, comprising:
a first conductive structure and a second conductive structure traversing each other; and
a memory cell electrically connecting the first and second conductive structures to each other, the memory cell including a selection element,
a surface of the first conductive structure contacting a bottom surface of the selection element so as to partially expose the bottom surface of the selection element, the surface of the first conductive structure including a plurality of recesses.

17. The variable resistance memory device of claim 16, further comprising:
a first conductive structure pattern consisting of a plurality of first conductive structures each extending in a first direction and collectively arranged along a second direction; and
a second conductive structure pattern consisting of a plurality of second conductive structures each extending in the second direction and collectively arranged along the first direction.

18. The variable resistance memory device of claim 16, wherein the first conductive structure includes a barrier layer pattern and a conductive layer pattern sequentially stacked, and
a width of the conductive layer pattern is equal to, or less than, a width of the barrier layer pattern.

19. The variable resistance memory device of claim 18, wherein
the conductive layer pattern has a plano-concave or bio-concave shape.

* * * * *